United States Patent
Takeuchi

(10) Patent No.: US 8,524,328 B2
(45) Date of Patent: Sep. 3, 2013

(54) METHODS FOR MANUFACTURING ORGANIC EL DISPLAY PANEL AND ORGANIC EL DISPLAY DEVICE

(75) Inventor: Takayuki Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 28 days.

(21) Appl. No.: 13/365,893

(22) Filed: Feb. 3, 2012

(65) Prior Publication Data

US 2012/0135556 A1 May 31, 2012

Related U.S. Application Data

(63) Continuation of application No. PCT/JP2010/004602, filed on Jul. 15, 2010.

(51) Int. Cl.
*B05D 1/02* (2006.01)
*H01L 51/40* (2006.01)

(52) U.S. Cl.
USPC ....... 427/427.3; 427/427.1; 438/99; 438/149; 438/479

(58) Field of Classification Search
USPC .............. 438/99, 149, 479; 427/427.1–427.3
See application file for complete search history.

(56) References Cited

U.S. PATENT DOCUMENTS

| | | | |
|---|---|---|---|
| 6,246,179 B1 | 6/2001 | Yamada | |
| 6,359,606 B1 | 3/2002 | Yudasaka | |
| 7,645,649 B1 * | 1/2010 | Lai et al. | 438/151 |
| 2002/0064966 A1 | 5/2002 | Seki et al. | |
| 2002/0089497 A1 | 7/2002 | Yudasaka | |
| 2004/0056588 A1 | 3/2004 | Nozawa | |
| 2004/0166761 A1 | 8/2004 | Seki et al. | |
| 2005/0264186 A1 | 12/2005 | Seki et al. | |
| 2005/0264187 A1 | 12/2005 | Seki et al. | |
| 2005/0266169 A1 | 12/2005 | Seki et al. | |
| 2006/0170111 A1 * | 8/2006 | Isa et al. | 257/775 |
| 2007/0018152 A1 | 1/2007 | Seki et al. | |
| 2007/0045616 A1 | 3/2007 | Tokuda et al. | |
| 2007/0117257 A1 | 5/2007 | Kim et al. | |
| 2008/0315760 A1 | 12/2008 | Seki et al. | |
| 2009/0009075 A1 | 1/2009 | Seki et al. | |
| 2009/0269871 A1 * | 10/2009 | Yamazaki et al. | 438/29 |

(Continued)

FOREIGN PATENT DOCUMENTS

| | | |
|---|---|---|
| JP | 11-74073 | 3/1999 |
| JP | 2001-175200 | 6/2001 |

(Continued)

*Primary Examiner* — Fernando L Toledo
*Assistant Examiner* — Peter Bradford
(74) *Attorney, Agent, or Firm* — Greenblum & Bernstein, P.L.C.

(57) ABSTRACT

Provided is an organic EL display panel offering improved luminance without increasing the current density of current flowing through organic light-emitting layers, comprising: substrate; TFT layer formed on substrate; planarizing film formed above TFT layer and having contact holes; lower electrodes arranged above planarizing film in a matrix in one-to-one correspondence with pixel units, and brought into conduction with TFT layer via contact holes; grid-shaped bank formed above planarizing film and defining openings corresponding one-to-one to lower electrodes; organic light-emitting layers formed in openings; and upper electrode formed above light-emitting layers. Each contact hole is positioned between a pair of openings adjacent in the column direction. At least one of opposing sides of any pair of openings adjacent in the column direction is reduced in width in the row direction and extends in the column direction so as to be adjacent in the row direction to the corresponding contact hole.

6 Claims, 14 Drawing Sheets

(56) References Cited

U.S. PATENT DOCUMENTS

2009/0302333 A1 12/2009 Seki et al.
2010/0006866 A1* 1/2010 Koyama ................ 257/88
2010/0104740 A1 4/2010 Shinohara

FOREIGN PATENT DOCUMENTS

| JP | 2003-109754 | 4/2003 |
| JP | 2004-95290 | 3/2004 |
| JP | 2004-335351 | 11/2004 |
| JP | 2005-276479 | 10/2005 |
| JP | 2005-322656 | 11/2005 |
| JP | 2006-88003 | 4/2006 |
| JP | 2007-26970 | 2/2007 |
| JP | 2007-149673 | 6/2007 |
| JP | 2007-207962 | 8/2007 |
| JP | 2009-231090 | 10/2009 |
| JP | 2010-73602 | 4/2010 |
| JP | 2010-104861 | 5/2010 |
| WO | 2010/023839 | 3/2010 |

* cited by examiner

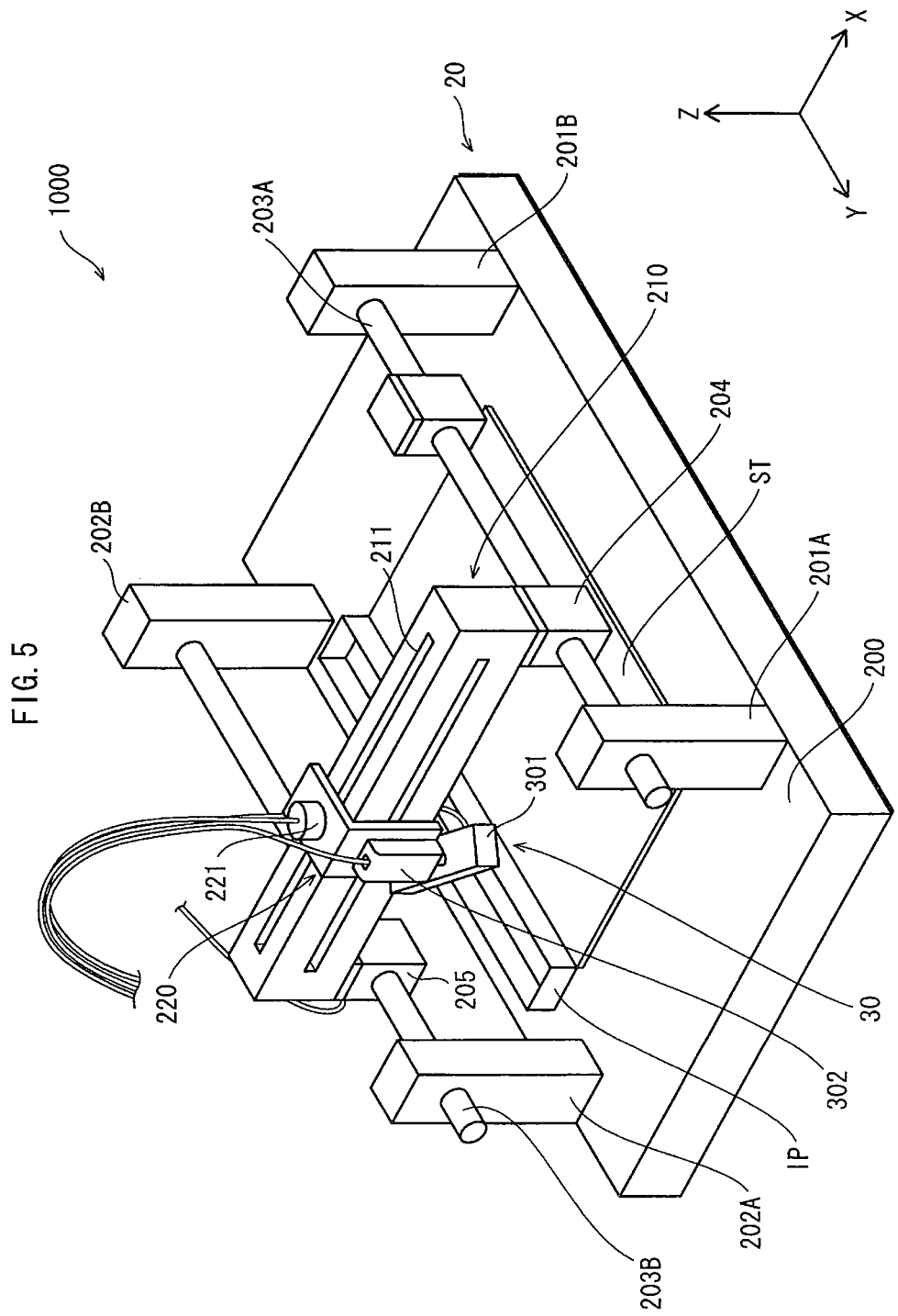

Direction of movement of head

Direction of movement of head

FIG. 13
Prior art
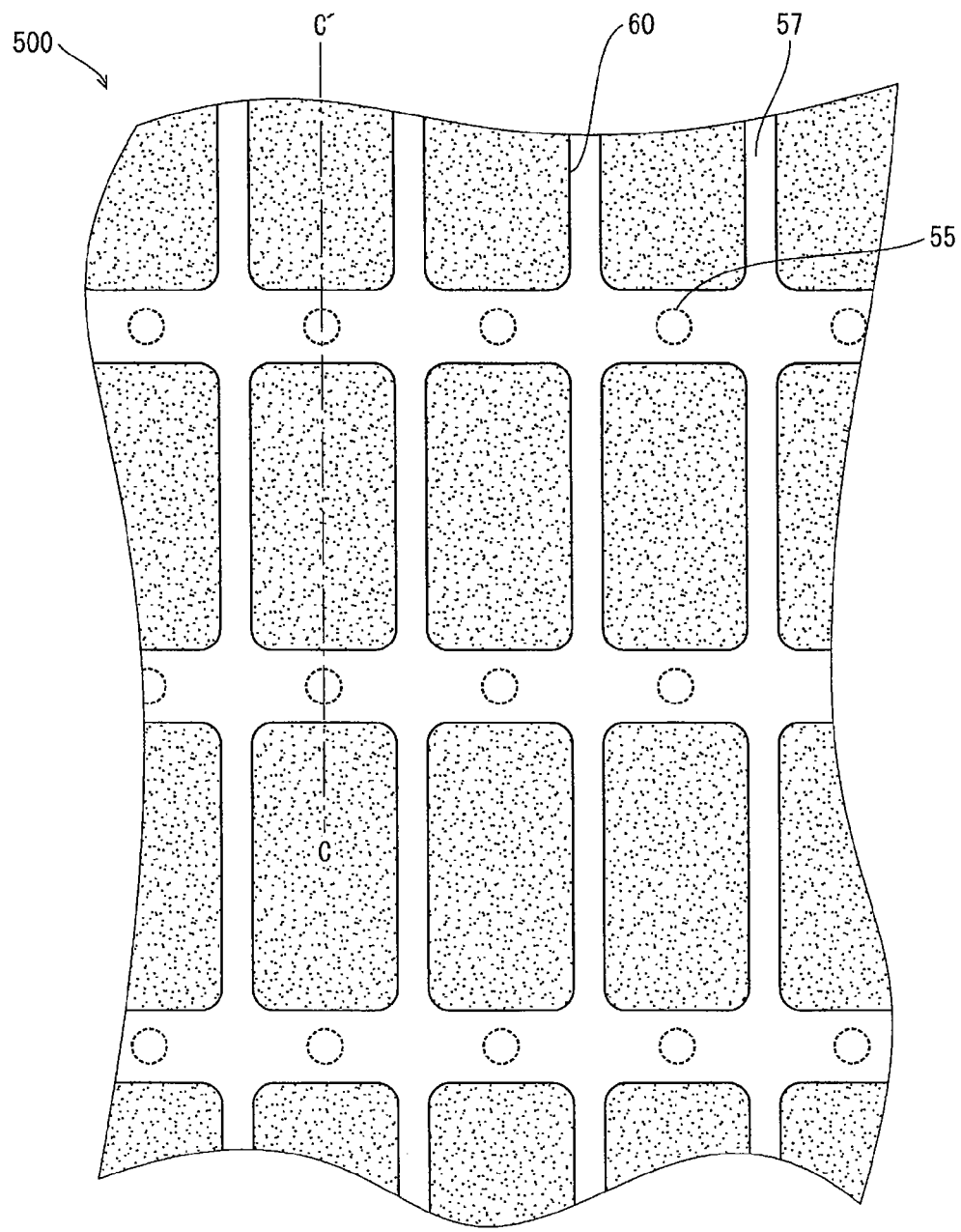
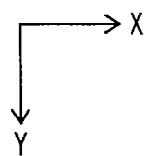

METHODS FOR MANUFACTURING ORGANIC EL DISPLAY PANEL AND ORGANIC EL DISPLAY DEVICE

This is a continuation of International Application PCT/JP2010/004602, with an international filing date of Jul. 15, 2010.

TECHNICAL FIELD

The present invention relates to an organic EL display panel and an organic EL display device that include organic EL elements, and to manufacturing methods therefor. In particular, the present invention relates to technology for improving the luminance of emitted light.

BACKGROUND ART

In recent years, research and development have been carried out on organic EL display panels in which organic EL elements are mounted on a substrate. These organic EL display panels are used as display devices. As an organic EL display panel uses organic EL elements that each emit light, the light from the organic EL display panel is highly visible. Furthermore, each organic EL element is a complete solid state device and thus has excellent impact resistance. Due to the above features, organic EL display panels are starting to spread as displays for small electronic devices (e.g., mobile phones) and televisions in recent years.

An organic EL element is a current-driven light-emitting element, and is normally configured by layering an organic light-emitting layer, a hole injection layer, a hole transport layer, an electron transport layer, an electron injection layer, and the like between a pair of electrodes, i.e., an anode and a cathode. Here, the organic light-emitting layer brings about the phenomenon of electroluminescence due to recombination of carriers.

FIG. 12 is a partial cross-sectional view showing the structure of a conventional organic EL display panel 500. The upper side of the organic EL display panel 500 in FIG. 12 is a display screen. In other words, the organic EL display panel 500 is of a top-emission type. FIG. 13 schematically shows the shape of a bank 57 as viewed perpendicular to the display screen of the organic EL display panel 500. For convenience, organic light-emitting layers 58 and an upper electrode 59 are omitted from FIG. 13. Note that the partial cross-sectional view of FIG. 12 is taken along C-C' in FIG. 13.

As shown in FIG. 12, a TFT layer 52, power supply electrodes 53, a planarizing film 54, and lower electrodes (anodes) 56 are layered in the stated order on a substrate 51. The planarizing film 54 has contact holes 55 via which the TFT layer 52 and the lower electrodes 56 are brought into conduction. A bank 57 is formed above the lower electrodes 56. The bank 57 is a grid defining openings 60 in which the organic light-emitting layers are to be formed in one-to-one correspondence. Once the organic light-emitting layers 58 are formed in the openings 60 in one-to-one correspondence, the upper electrode (cathode) 59 is layered so as to cover the organic light-emitting layers 58.

As shown in FIG. 13, each opening 60 has a substantially rectangular shape whose lengthwise direction extends along a column (Y) direction. The plurality of openings 60 are arranged in a matrix. Each contact hole 55 is located between a corresponding pair of openings 60 adjacent in the column direction. The contact holes 55 are covered by the bank 57. If the contact holes 55 are not covered by the bank 57, the organic light-emitting layers 58 would not be flat because of the presence of the contact holes 55; this could cause unevenness in light emission and the like. To prevent this problem, the bank 57 is formed so as to cover the contact holes 55 as shown in FIGS. 12 and 13.

CITATION LIST

Patent Literature

[Patent Literature 1]
JP Patent Application Publication No. 2007-207962
[Patent Literature 2]
JP Patent Application Publication No. 2005-322656

SUMMARY OF INVENTION

Technical Problems

In recent years, there has been a demand for further improvement in the luminance of organic EL display panels. As the luminance of organic EL elements increases in accordance with the current density of current flowing through the organic light-emitting layers, the luminance of organic EL display panels can be improved by increasing the current density of current flowing through the organic light-emitting layers. However, increasing the current density of current flowing through the organic light-emitting layers gives rise to several problems (e.g., deterioration of various layers including the organic light-emitting layers). Therefore, there is a limit to increasing the current density of current flowing through the organic light-emitting layers.

Provided is an organic EL display panel that offers high luminance without increasing the current density of current flowing through the organic light-emitting layers.

Solution to Problems

One embodiment provides an organic EL display panel comprising: a substrate; a TFT layer formed on the substrate; a planarizing film formed above the TFT layer and provided with contact holes; a plurality of lower electrodes arranged above the planarizing film in a matrix in such a manner that the TFT layer and the lower electrodes are brought into conduction via the contact holes, the lower electrodes corresponding one-to-one to pixel units; a bank formed above the planarizing film and being a grid defining a plurality of openings corresponding one-to-one to the lower electrodes; organic light-emitting layers formed in the openings in one-to-one correspondence; and an upper electrode formed above the organic light-emitting layers. Each contact hole is positioned between a corresponding pair of the openings adjacent in the column direction. At least one of opposing sides of any pair of the openings adjacent in the column direction includes a reduced-width area that (i) is reduced in width and (ii) extends in the column direction toward an area adjacent in the row direction to a corresponding one of the contact holes.

Advantageous Effects of Invention

According to the organic EL display panel pertaining to the above embodiment, at least one of opposing sides of any pair of the openings adjacent in the column direction includes a reduced-width area that (i) is reduced in width and (ii) extends in the column direction toward an area adjacent in the row direction to a corresponding one of the contact holes. On the other hand, in the conventional structure, sides of the openings do not include the reduced-width areas that extend in the column direction. The above embodiment can enlarge the area of each opening, namely the area of light emission, by providing the reduced-width area to each opening. With the enlarged area of light emission, the luminance of emitted light can be improved without changing the current density of current flowing through the organic light-emitting layers. Therefore, the organic EL display panel of the above embodiment offers high luminance without increasing the current density of current flowing through the organic light-emitting layers.

BRIEF DESCRIPTION OF DRAWINGS

FIG. 5 shows a main structure of an inkjet device system.

FIG. 13 is a schematic diagram showing the shape of a bank of a conventional organic EL display panel.

DESCRIPTION OF EMBODIMENTS

Aspects of Invention

Figure 1:
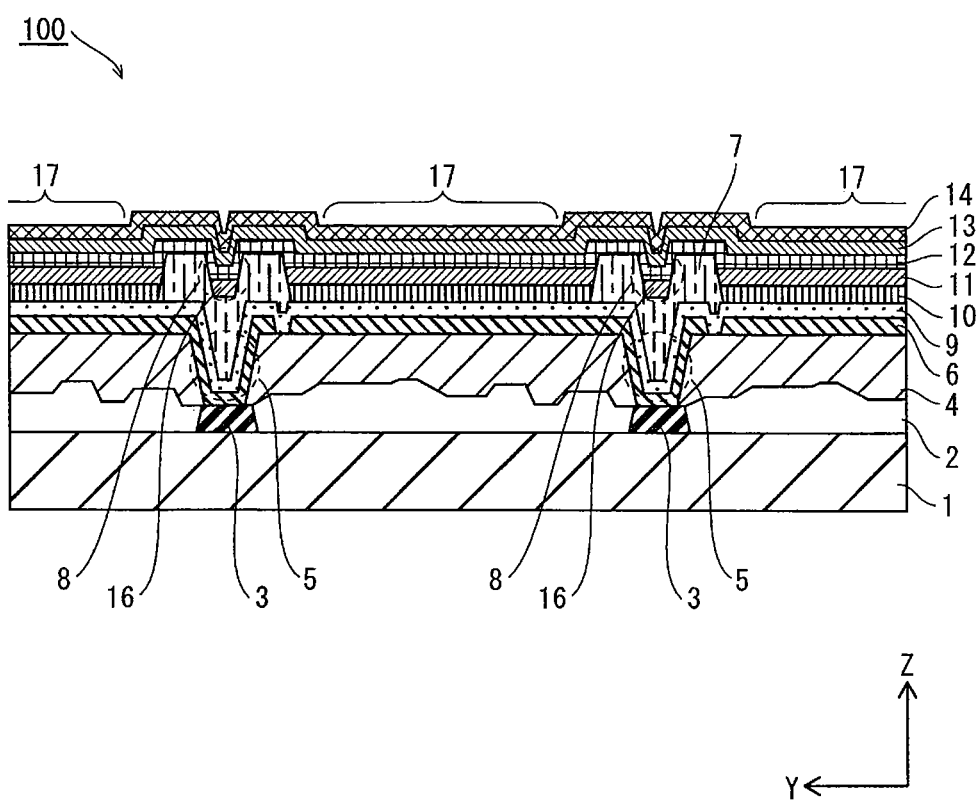
FIG. 1 is a partial cross-sectional view showing the structure of an organic EL display panel pertaining to Embodiment 1.

Other embodiment provides a method of manufacturing an organic EL display panel, comprising the steps of: preparing a substrate; forming a TFT layer on the substrate; forming a planarizing film above the TFT layer; providing a plurality of contact holes in the planarizing film such that the contact holes penetrate the planarizing film; arranging a plurality of lower electrodes in a matrix above the planarizing film in such a manner that the TFT layer and the lower electrodes are brought into conduction via the contact holes, the lower electrodes corresponding one-to-one to pixel units; forming, above the planarizing film, a bank being a grid defining a plurality of openings corresponding one-to-one to the lower electrodes; forming organic light-emitting layers in the openings in one-to-one correspondence; and forming an upper electrode above the organic light-emitting layers. Here, the bank is formed such that each contact hole is positioned between a corresponding pair of the openings adjacent in a column direction, and such that at least one of opposing sides of any pair of the openings adjacent in the column direction includes a reduced-width area that (i) is reduced in width in a row direction and (ii) extends in the column direction so as to be adjacent in the row direction to a corresponding one of the contact holes. The organic light-emitting layers are formed by (i) causing a plurality of nozzles provided in an inkjet head to eject drops of ink into each opening, the ink containing one or more solvents and one or more organic materials to constitute the organic light-emitting layers, and (ii) drying the one or more solvents by evaporation. In the step of forming the organic light-emitting layers, (i) the inkjet head is positioned so that the nozzles are aligned in the column direction, (ii) while the inkjet head is being moved in the row direction, every one of the nozzles is set to eject the drops of ink by (a) causing predetermined nozzles that pass over the contact holes to eject the drops of ink into the reduced-width area of each opening, the predetermined nozzles being included among the nozzles, and (b) causing the rest of the nozzles other than the predetermined nozzles to eject the drops of ink into an area of each opening excluding the reduced-width area thereof, and (iii) as to any pair of the openings adjacent in the column direction, a column-direction gap between opposing edges of the reduced-width area of one opening and the other opening is smaller than a column-direction gap between any pair of the nozzles adjacent in the column direction.

According to the method of manufacturing an organic EL display panel of the above embodiment, the organic light-emitting layers are formed in an application process using an inkjet method. In this way, the material of the organic light-emitting layers can be efficiently used, and the manufacturing cost can be reduced. In addition, the inkjet method is advantageous in enabling application to large-sized organic EL display panels and fine patterning.

Furthermore, the area of each opening is further enlarged by making the reduced-width area of each opening extend in the column direction so as to be adjacent in the row direction to the corresponding contact hole.

In the case where the ink is applied in the application process by moving the inkjet head in the row direction, a conventional layout of openings is such that the nozzles that pass over the contact holes are set not to eject the drops of ink. As the drops of ink for the organic light-emitting layers have high viscosity, there is a possibility that these nozzles that are set not to eject the drops of ink be clogged. On the other hand, according to the above embodiment, the predetermined nozzles that pass over the contact holes eject the drops of ink for the organic light-emitting layers into the reduced-width area of each opening. As every nozzle ejects the drops of ink, clogging of the nozzles can be prevented in the above embodiment.

Furthermore, according to the above embodiment, while the inkjet head is moving in the row direction, the predetermined nozzles that pass over the contact holes eject the drops of ink into the reduced-width area of each opening. Furthermore, the remaining nozzles other than the predetermined nozzles eject the drops of ink into an area of each opening excluding the reduced-width area thereof. With the above structure, by moving the inkjet head across the panel in the row direction, every nozzle ejects the drops of ink into each opening including the reduced-width area. This can prevent clogging of the nozzles in an effective manner.

If one or more nozzles become unusable due to clogging, the total amount of ink drops ejected into each opening is maintained by causing, out of all the nozzles used to eject the ink drops into the openings, nozzles other than the unusable nozzles to eject a larger amount of ink drops. Here, when at least one of opposing sides of any pair of the openings adjacent in the column direction includes the reduced-width area, the predetermined nozzles that pass over the contact holes eject the ink drops into the reduced-width area of each opening. This way, the number of nozzles used to eject the ink drops into each opening can be increased as compared to the conventional structure. Furthermore, in a case where both of opposing sides of any pair of the openings adjacent in the column direction include the reduced-width areas that are partially adjacent in the row direction to each other, the predetermined nozzles that pass over these reduced-width areas can eject the ink drops into both of the pair of the openings adjacent in the column direction. Therefore, as compared to a case where the opposing ends of any pair of the openings adjacent in the column direction do not include the reduced-width areas that are adjacent in the row direction to each other, the above embodiment can further increase the number of nozzles used to eject the ink drops into each opening. When there are one or more unusable nozzles, increasing the number of nozzles used to eject the ink drops into each opening makes it possible to suppress the increase in the amount of ink drops ejected from each of the nozzles other than the unusable nozzles. This way, the total amount of ink drops ejected into each opening can be easily maintained.

An organic EL display panel of one embodiment comprises: a substrate; a TFT layer formed on the substrate: a planarizing film formed above the TFT layer and having a plurality of contact holes; a plurality of lower electrodes arranged above the planarizing film in a matrix in such a manner that the lower electrodes and the TFT layer are brought into conduction via the contact holes, the lower electrodes corresponding one-to-one to pixel units; a bank formed above the planarizing film, the bank being a grid defining a plurality of openings corresponding one-to-one to the lower electrodes; a plurality of organic light-emitting layers formed in the openings in one-to-one correspondence; and an upper electrode formed above the organic light-emitting layers. Here, each contact hole is positioned between a corresponding pair of the openings adjacent in the column direction. At least one of opposing sides of any pair of the openings adjacent in the column direction includes a reduced-width area that (i) is reduced in width in the row direction and (ii) extends in the column direction toward an area adjacent in the row direction to a corresponding one of the contact holes.

According to the above embodiment, at least one of opposing sides of any pair of the openings adjacent in the column direction includes a reduced-width area that (i) is reduced in width in the row direction and (ii) extends in the column direction toward an area adjacent in the row direction to a corresponding one of the contact holes. In contrast, according to the conventional structure, sides of the openings do not extend in the column direction. With the above embodiment, at least one side of each opening extends in the column direction, and accordingly, the area of each opening, i.e., the area of light emission, can be enlarged. This can improve the luminance of emitted light without changing the current density of current flowing through the organic light-emitting layers.

In one embodiment, both of opposing sides of any pair of the openings adjacent in the column direction may include the reduced-width area. As to opposing sides of any pair of the openings adjacent in the column direction, the reduced-width area of one side may extend in the column direction past the corresponding contact hole so as to be adjacent in the row direction to the reduced-width area of the other side.

The above structure can also enlarge the area of each opening as compared to the conventional structure.

Furthermore, in one embodiment, at least one of opposing sides of any pair of the openings adjacent in the column direction may include the reduced-width area that extends in the column direction so as to at least be adjacent in the row direction to the corresponding contact hole.

The area of each opening can be further enlarged with the above structure, in which at least one of opposing sides of any pair of the openings adjacent in the column direction includes the reduced-width area that extends in the column direction so as to at least be adjacent in the row direction to the corresponding contact hole.

In one embodiment, (i) each contact hole may be distanced in the row direction from a virtual line passing through the centers of the corresponding column of the openings, and (ii) at least one of opposing sides of any pair of the openings adjacent in the column direction may include the reduced-width area that extends in the column direction toward an area opposite from the corresponding contact hole with respect to the virtual line.

The area of each opening can be enlarged also with the above structure, in which (i) each contact hole is in the row direction from a virtual line passing through the centers of the corresponding column of the openings, and (ii) at least one of opposing sides of any pair of the openings adjacent in the column direction includes the reduced-width area that extends in the column direction toward an area opposite from the corresponding contact hole with respect to the virtual line.

In one embodiment, (i) each contact hole may be positioned on a virtual line passing through the centers of the corresponding column of the openings, and (ii) at least one of opposing sides of any pair of the openings adjacent in the column direction may include the reduced-width area that extends in the column direction toward an area adjacent in the row direction to the corresponding contact hole.

The area of each opening can be enlarged also with the above structure, in which (i) each contact hole is positioned on a virtual line passing through the centers of the corresponding column of the openings, and (ii) at least one of opposing sides of any pair of the openings adjacent in the column direction includes the reduced-width area that extends in the column direction toward an area adjacent in the row direction to the corresponding contact hole.

In one embodiment, hole injection layers may be provided between the lower electrodes and the organic light-emitting layers.

By thus providing the hole injection layers, injection of holes from the lower electrodes to the organic light-emitting layers is facilitated. This results in further improvement in the luminance.

In one embodiment, an electron injection layer may be provided between the organic light-emitting layers and the upper electrode.

By thus providing the electron injection layer, injection of electrons from the upper electrode to the organic light-emitting layers is facilitated. This results in further improvement in the luminance.

In one embodiment, a plurality of concavities may be provided in portions of the bank as a result of the portions sinking into the contact holes.

Normally, in the process of forming the bank, concavities are formed in portions of the bank as a result of the portions sinking into the contact holes. With the above embodiment, even if such concavities exist, the area of each opening can be enlarged regardless of such concavities. Accordingly, there is no need to separately perform an additional process for forming the concavities.

Furthermore, an organic EL display device of one embodiment comprises an organic EL display panel having the above-described structure. This way, the organic EL display device of one embodiment can achieve the advantageous effects that are achieved by the organic EL display panel having the above-described structure.

One embodiment is a method comprising the steps of: preparing a substrate; forming a TFT layer on the substrate; forming a planarizing film above the TFT layer; forming a plurality of contact holes in the planarizing film; forming a plurality of lower electrodes above the planarizing film in a matrix in such a manner that the TFT layer and the lower electrodes are brought into conduction via the contact holes, the lower electrodes corresponding one-to-one to pixel units; forming, above the planarizing film, a bank being a grid defining a plurality of openings corresponding one-to-one to the lower electrodes; forming a plurality of organic light-emitting layers in the openings in one-to-one correspondence; and forming an upper electrode above the organic light-emitting layers. Here, the bank may be formed such that each contact hole is positioned between a corresponding pair of the openings adjacent in a column direction, and such that at least one of opposing sides of any pair of the openings adjacent in the column direction includes a reduced-width area that (i) is reduced in width in the row direction and (ii) extends in the column direction toward an area adjacent in the row direction to a corresponding one of the contact holes.

According to the above embodiment, at least one of opposing sides of any pair of the openings adjacent in the column direction includes a reduced-width area that (i) is reduced in width in the row direction and (ii) extends in the column direction toward an area adjacent in the row direction to a corresponding one of the contact holes. In contrast, according to the conventional structure, sides of the openings do not extend in the column direction. With the above embodiment, at least one side of each opening extends in the column direction, and accordingly, the area of each opening, i.e., the area of light emission, can be enlarged. This can improve the luminance of emitted light without changing the current density of current flowing through the organic light-emitting layers.

In one embodiment, the bank may be formed in such a manner that (i) both of opposing sides of any pair of the openings adjacent in the column direction include the reduced-width area, and (ii) as to opposing sides of any pair of the openings adjacent in the column direction, the reduced-width area of one side extends in the column direction past the corresponding contact hole so as to be adjacent in the row direction to the reduced-width area of the other side.

The above structure can also enlarge the area of each opening as compared to the conventional structure.

In one embodiment, the organic light-emitting layers may be formed by (i) causing a plurality of nozzles provided in an inkjet head to eject drops of ink into each opening, the ink containing an organic material to constitute the organic light-emitting layers and solvent, and (ii) drying the solvent by evaporation.

By forming the organic light-emitting layers in an application step using an inkjet method, the material of the organic light-emitting layers can be efficiently used, and the manufacturing cost can be reduced. In addition, the inkjet method is advantageous in enabling application to large-sized organic EL display panels and fine patterning.

In one embodiment, at least one of opposing sides of any pair of the openings adjacent in the column direction may include the reduced-width area that extends in the column direction so as to at least be adjacent in the row direction to the corresponding contact hole.

The area of each opening can be further enlarged with the above structure, in which at least one of opposing sides of any pair of the openings adjacent in the column direction includes the reduced-width area that extends in the column direction so as to at least be adjacent in the row direction to the corresponding contact hole.

In one embodiment, in the step of forming the organic light-emitting layers, (i) the inkjet head may be positioned so that the nozzles are aligned along the column direction, and (ii) while the inkjet head is moving in the row direction, the drops of ink may be ejected into the reduced-width area of each opening from, out of the nozzles, predetermined nozzles that pass over the contact holes.

In the case where the ink is applied in the application process by moving the inkjet head in the row direction, a conventional layout of openings is such that the nozzles that pass over the contact holes are set not to eject the drops of ink. As the drops of ink for the organic light-emitting layers have high viscosity, there is a possibility that these nozzles that are set not to eject the drops of ink be clogged. On the other hand, according to the above embodiment, the predetermined nozzles that pass over the contact holes eject the drops of ink into the reduced-width area of each opening. As every nozzle ejects the drops of ink, clogging of the nozzles can be prevented in the above embodiment.

If one or more nozzles become unusable due to clogging, the total amount of ink drops ejected into each opening is maintained by causing, out of all the nozzles used to eject the ink drops into the openings, nozzles other than the unusable nozzles to eject a larger amount of ink drops. Here, when at least one of opposing sides of any pair of the openings adjacent in the column direction includes the reduced-width area, the predetermined nozzles that pass over the contact holes eject the ink drops into the reduced-width area of each opening. This way, the number of nozzles used to eject the ink drops into each opening can be increased as compared to the conventional structure. Furthermore, in a case where both of opposing sides of any pair of the openings adjacent in the column direction include the reduced-width areas that are adjacent in the row direction to each other, the predetermined nozzles that pass over these reduced-width areas can eject the ink drops into both of the pair of the openings adjacent in the column direction. Therefore, as compared to a case where the opposing sides of any pair of the openings adjacent in the column direction do not include such reduced-width areas that are adjacent in the row direction to each other, the above embodiment can further increase the number of nozzles used to eject the ink drops into each opening. When there are one or more unusable nozzles, increasing the number of nozzles used to eject the ink drops into each opening makes it possible to suppress the increase in the amount of ink drops ejected from each of the nozzles other than the unusable nozzles. This way, the total amount of ink drops ejected into each opening can be easily maintained.

In one embodiment, (i) in the step of forming the bank, a plurality of concavities may be formed in portions of the bank as a result of the portions sinking into the contact holes, and (ii) in the step of forming the organic light-emitting layers, the drops of ink for the organic light-emitting layers may be ejected from the predetermined nozzles that pass over the contact holes into each concavity.

Normally, in the process of forming the bank, concavities are formed in portions of the bank as a result of the portions sinking into the contact holes provided in the planarizing film. By forming the concavities while making use of the existing contact holes as in the above embodiment, it is not required to separately perform an additional step of forming the concavities. In this way, the manufacturing efficiency is improved.

Here, at least one of opposing sides of any pair of the openings adjacent in the column direction includes the reduced-width area that extends in the column direction so as to at least be adjacent in the row direction to the corresponding contact hole. Therefore, by moving the inkjet head in the row direction directly after causing the predetermined nozzles that pass over the contact holes to eject the drops of ink for the organic light-emitting layers into the reduced-width area of each opening, the drops of ink for the organic light-emitting layers can be ejected into each concavity in which the organic light-emitting layer is not formed (dummy ejection). This can increase the frequency of ejection by the predetermined nozzles that pass over the contact holes, thus preventing clogging of the nozzles in a more effective manner.

The organic light-emitting layers are formed by (i) causing the nozzles to eject the drops of ink for the organic light-emitting layers into the reduced-width area of each opening and each concavity and (ii) drying the solvent contained in the drops of ink by evaporation (in the concavities, the ejected drops of ink do not function as the organic light-emitting layers). By ejecting the drops of ink for the organic light-emitting layers into the reduced-width area of each opening and each concavity, the degree at which the vaporized solvent freely diffuses is reduced across the entire organic EL display panel, especially in the reduced-width area of each opening, as compared to the conventional structure. This makes the concentration of the vaporized solvent uniform. Due to this advantageous effect, the organic light-emitting layers having a uniform thickness can be formed. Accordingly, various types of unevenness in light emission (e.g., unevenness in light emission in the row and column directions, and unevenness in light emission across the surface) can be suppressed, and excellent image display performance can be achieved as compared to conventional techniques.

In one embodiment, the step of forming charge transport layers in the openings in one-to-one correspondence may be performed between the step of forming the bank and the step of forming the organic light-emitting layers. The charge transport layers may be formed by (i) causing the nozzles provided in the inkjet head to eject drops of ink into each opening, the ink containing an organic material to constitute the charge transport layers and solvent, and (ii) drying the solvent by evaporation.

By providing the charge transport layers, carriers (electrons and holes) received from the electrodes can be efficiently transported to the organic light-emitting layers. This can further improve the luminance. Furthermore, as the charge transport layers can be formed in an application process using an inkjet method, it is possible to provide an organic EL display panel with high luminance while suppressing the manufacturing cost.

In one embodiment, in the step of forming the charge transport layers, (i) the inkjet head may be positioned so that the nozzles are aligned along the column direction, and (ii) while the inkjet head is moving in the row direction, the predetermined nozzles that pass over the contact holes may eject the drops of ink for the charge transport layers into the reduced-width area of each opening.

In the case where the ink is applied in the application process by moving the inkjet head in the row direction, a conventional layout of openings is such that the nozzles that pass over the contact holes are set not to eject the drops of ink. As the drops of ink for the charge transport layers have high viscosity, there is a possibility that these nozzles that are set not to eject the drops of ink be clogged. On the other hand, according to the above embodiment, the predetermined nozzles that pass over the contact holes eject the drops of ink into the reduced-width area of each opening. As every nozzle ejects the drops of ink, clogging of the nozzles can be prevented in the above embodiment.

Furthermore, in a case where one of opposing sides of any pair of the openings adjacent in the column direction includes the reduced-width area, the number of nozzles used to eject the ink drops into each opening can be increased as compared to the conventional structure. In a case where both of opposing sides of any pair of the openings adjacent in the column direction include the reduced-width areas that are adjacent in the row direction to each other, the number of nozzles used to eject the ink drops into each opening can be further increased as compared to a case where the opposing sides of any pair of the openings adjacent in the column direction do not include the reduced-width areas that are adjacent in the row direction to each other. Therefore, even when one or more nozzles are unusable, the above embodiment can easily maintain the total amount of ink drops to be ejected into each opening.

In one embodiment, (i) in the step of forming the bank, a plurality of concavities may be formed in portions of the bank as a result of the portions sinking into the contact holes, and (ii) in the step of forming the charge transport layers, drops of ink for the charge transport layers may be ejected from the predetermined nozzles that pass over the contact holes into each concavity.

Here, at least one of opposing sides of any pair of the openings adjacent in the column direction includes the reduced-width area that extends in the column direction so as to at least be adjacent in the row direction to the corresponding contact hole. Therefore, by moving the inkjet head in the row direction directly after causing the predetermined nozzles that pass over the contact holes to eject the drops of ink for the charge transport layers into the reduced-width area of each opening, the drops of ink for the charge transport layers can be ejected into each concavity in which the charge transport layer is not formed (dummy ejection). This can increase the frequency of ejection by the predetermined nozzles that pass over the contact holes, thus preventing clogging of the nozzles in a more effective manner.

The charge transport layers are formed by (i) causing the nozzles to eject the drops of ink for the charge transport layers into the reduced-width area of each opening and each concavity and (ii) drying the solvent contained in the drops of ink by evaporation (in the concavities, the ejected drops of ink do not function as the charge transport layers). By ejecting the drops of ink for the charge transport layers into the reduced-width area of each opening and each concavity, the degree at which the vaporized solvent freely diffuses is reduced across the entire organic EL display panel, especially in the reduced-width area of each opening, as compared to the conventional structure. This makes the concentration of the vaporized solvent uniform. Due to this advantageous effect, the charge transport layers having a uniform thickness can be formed. Accordingly, various types of unevenness in light emission (e.g., unevenness in light emission in the row and column directions, and unevenness in light emission across the surface) can be suppressed, and excellent image display performance can be achieved as compared to conventional techniques.

Embodiment 1

<Overall Schematic Structure>

Figure 2:
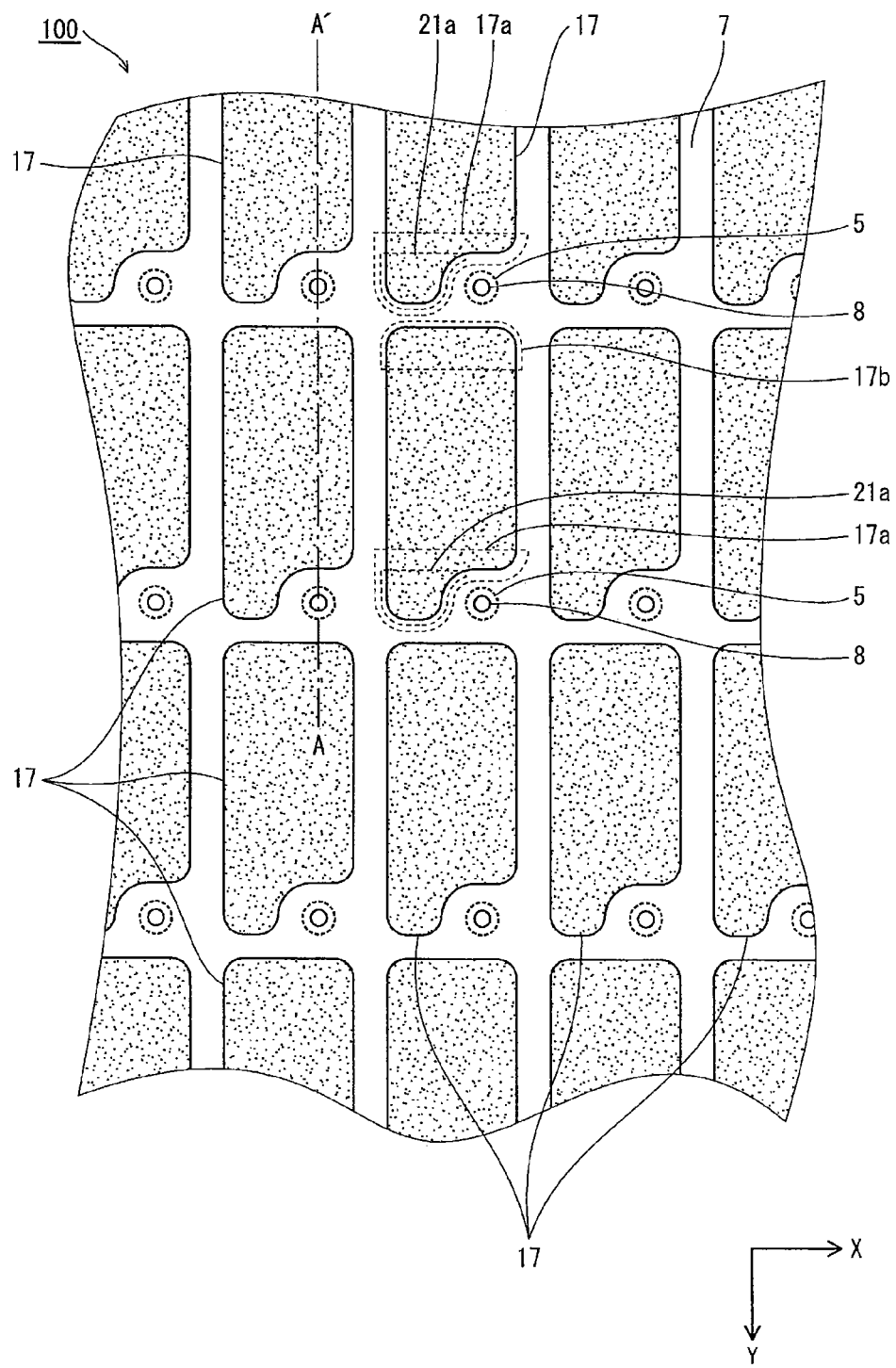
FIG. 2 is a schematic diagram showing the shape of a bank of an organic EL display panel pertaining to Embodiment 1.

FIG. 1 is a partial cross-sectional view showing the structure of an organic EL display panel 100 pertaining to Embodiment 1. The upper side of the organic EL display panel 100 in FIG. 1 is a display screen. In other words, the organic EL display panel 100 is of a top-emission type. FIG. 2 schematically shows the shape of a bank 7 as viewed perpendicular to the display screen of the organic EL display panel 100. For convenience, hole transport layers 10, organic light-emitting layers 11, an electron transport layer 12, an electron injection layer 13, and an upper electrode 14 are omitted from FIG. 2. Note that the partial cross-sectional view of FIG. 1 is taken along A-A' in FIG. 2.

As shown in FIG. 1, a TFT layer 2, power supply electrodes 3, a planarizing film 4, lower electrodes 6, and a hole injection layer 9 are layered in the stated order on a substrate 1. A bank 7 is formed on the hole injection layer 9. The bank 7 is a grid defining openings 17 in which the organic light-emitting layers 11 are to be formed in one-to-one correspondence. In each opening 17, the hole transport layer 10, the organic light-emitting layer 11, the electron transport layer 12, the electron injection layer 13, and the upper electrode 14 are layered in the stated order.

<Structure of Layers (from Substrate to Bank)>

The following describes the substrate 1, the TFT layer 2, the power supply electrodes 3, the planarizing film 4, the lower electrodes 6, the hole injection layer 9, and the bank 7.

The substrate 1 is a back substrate of the organic EL display panel 100. The TFT layer 2 is formed on the front surface of the substrate 1. The TFT layer 2 contains thin-film transistors (TFTs) for driving the organic EL display panel 100 by an active matrix method. The power supply electrodes 3 are formed in the upper surface of the TFT layer 2. The power supply electrodes 3 supply power from the outside to each TFT.

The planarizing film 4 is provided to flatten the surface unevenness caused by the presence of the TFT layer 2 and the power supply electrodes 3. The planarizing film 4 is formed from an organic material with excellent insulating properties.

Contact holes 5 are provided so as to bring the power supply electrodes 3 and the lower electrodes 6 into conduction, and extend from the front surface to the back surface of the planarizing film 4. Each contact hole 5 is located between a corresponding pair of openings 17 adjacent in the column direction. The contact holes 5 are covered by the bank 7. The above structure prevents disadvantages arising from the presence of the contact holes 5, such as inability to flatten the layers formed above the bank 7.

The lower electrodes 6 are anodes and provided in one-to-one correspondence with the organic light-emitting layers 11, which are formed in the openings 17 in one-to-one correspondence. Since the organic EL display panel 100 is of a top-emission type, a light-reflective material is used as the material of the lower electrodes 6.

The hole injection layer 9 is provided in order to facilitate injection of holes from the lower electrodes 6 to the organic light-emitting layers 11.

(Structure of Bank 7)

The bank 7 has a function of preventing the ink corresponding to one of the colors red (R), green (G) and blue (B) from being mixed with the ink corresponding to a different color during the formation of the organic light-emitting layers 11. The ink contains a material to constitute the organic light-emitting layers and a solvent Most portions of the bank 7, which is provided to cover the upper parts of the contact holes 5, have a trapezoidal cross-section in an XY-plane or a YZ-plane. However, portions of the bank 7 corresponding to the contact holes 5 have sunk due to shrinking of the material of the bank 7. Hereinafter, these sunken portions of the bank 7 are referred to as concavities 8.

With reference to FIG. 2, the following describes the shape of the bank 7 as viewed perpendicular to the display screen of the organic EL display panel 100.

As shown in FIG. 2, the plurality of openings 17 defined by the bank 7 are arranged in a matrix. The openings 17 are areas where the organic light-emitting layers 11 are formed in one-to-one correspondence. The arrangement and the shape of the organic light-emitting layers 11 are defined by the arrangement and the shape of the openings 17. Each opening 17 has a substantially rectangular shape whose lengthwise direction extends along the column (Y) direction. By way of example, the sides of each opening 17 extending along the row (X) direction are approximately 100 μm in length, and the sides of each opening 17 extending along the column (Y) direction are approximately a few 100 μm in length. In each opening 17, the organic light-emitting layer 11 corresponding to one of R, G, and B is formed. The organic light-emitting layers 11 formed in the respective openings 17 are subpixels. A set of tree subpixels corresponding to R, G and B, respectively, constitutes one pixel. Each contact hole 5 is located between a corresponding pair of openings 17 adjacent in the column direction. That is, the contact holes 5 are located below the bank 7. It has been described above that the lower electrodes 6 are provided in one-to-one correspondence with the organic light-emitting layers 11, which are formed in the openings 17 in one-to-one correspondence. This means that the lower electrodes 6 are provided in one-to-one correspondence with the subpixels.

Here, attention should be drawn to each opening 17. As described earlier, each opening 17 has a substantially rectangular shape. In addition, the two opposite sides of each opening, namely a first side 17a and a second side 17b, have different shapes. Assume that the openings 17, each having these first side 17a and second side 17b, are arranged in a matrix in the same orientation. In this case, as to any pair of openings 17 adjacent in the column direction, the first side 17a of one opening 17 faces the differently-shaped second side 17b of the other opening 17 along the column direction, as shown in FIG. 2.

Next, attention should be drawn to the shape of the first side 17a of each opening 17. The first side 17a of each opening 17 includes an area 21a that (i) is reduced in width in the row direction and (ii) extends in the column direction toward an area adjacent in the row direction to the corresponding contact hole 5. Put another way, the first side 17a of each opening 17 is partially expanded in such a manner as to avoid the corresponding contact hole 5. As described above, the first side 17a of each opening 17 includes (i) an area having the original width of the opening 17, and (ii) an area 21a having a width smaller than the original width of the opening 17 (hereinafter, this area 21a having a width smaller than the original width of the opening 17 is simply referred to as a "reduced-width area 21a"). On the other hand, the second side 17b of each opening 17 has the original width of the opening 17.

In terms of improvement in the luminance of emitted light, it is preferable to make the reduced-width area 21a of each opening 17 as large as possible. However, making the reduced-width area 21a of each opening 17 too large gives rise to the following problems.

Firstly, when the reduced-width area 21a of each opening 17 is expanded too far toward the opposing second side 17b, there is a possibility that the ink ejected into one opening 17 may be mixed with the ink ejected into another opening 17 adjacent in the column direction during the process of forming the organic light-emitting layers 11. Furthermore, when the reduced-width area 21a of each opening 17 is expanded too far toward the opposing second side 17b, a recess formed between each pair of the lower electrodes 6, which are formed in one-to-one correspondence with the subpixels (i.e., a portion where no lower electrode 6 is formed), cannot be covered by the bank 7. As a result, the layers formed above the bank 7 partially sink into each recess and therefore do not become flat. This could cause unevenness in light emission and the like. In view of the above, when expanding the reduced-width area 21a of each opening 17 toward the opposing second side 17b, it is preferable to (i) provide a gap between the reduced-width area 21a and the opposing second side 17b to prevent the ink ejected into one opening 17 from being mixed with the ink ejected into another adjacent opening 17, and (ii) provide the reduced-width area 21a above the corresponding lower electrode 6.

Secondly, when the reduced-width area 21a of each opening 17 is expanded too far toward the corresponding contact hole 5, the bank 7 cannot cover the entirety of the recesses formed by the lower electrodes 6 partially sinking into the contact holes 5. This case similarly brings about the disadvantage that the layers formed above the bank 7 do not become flat. In view of the above, when expanding each reduced-width area 21a of each opening toward the corresponding contact hole 5, it is preferable to provide the reduced-width area 21 above the corresponding lower electrode 6 in an area where there is no recess formed due to the corresponding contact hole 5.

Moreover, if the shape of the reduced-width area 21a of each opening 17 has one or more angles, the ink ejected thereinto does not evenly spread all the way to areas of such angles, because the ink used in an application process utilizing an inkjet method has high viscosity. This gives rise to the problem of uneven organic light-emitting layers 11. In view of the above, it is preferable that the shape of each reduced-width area 21a have no angles, as shown in FIG. 2.

The luminance of subpixels increases in proportion to the size of the area of each organic light-emitting layer 11, i.e., the size of the area of each opening 17. The area of each opening 17 is larger in the present embodiment, in which each first side 17a has the reduced-width area 21a, than in a case where each first side 17a has the original width of the opening 17. As a result, the luminance of emitted light can be improved without increasing the current density of current flowing through the organic light-emitting layers. Furthermore, in the present embodiment, each contact hole 5 is positioned with a row-direction distance from a virtual line passing through the centers of the corresponding column of openings 17, and accordingly, each reduced-width area 21a extends in the column direction so as to be adjacent in the row direction to the corresponding contact hole 5. In this way, the area of each opening 17 is further enlarged and the luminance of emitted light is further improved, as compared to a case where each contact hole 5 is positioned on a virtual line passing through the centers of the corresponding column of openings 17.

<Structure of Layers (From Hole Transport Layers to Upper Electrode)>

Returning to the partial cross-sectional view of FIG. 1, the following describes the hole transport layers 10, the organic light-emitting layers 11, the electron transport layer 12, the electron injection layer 13, and the upper electrode 14.

The hole transport layers 10 have a function of transporting the holes injected by the lower electrodes 6 to the organic light-emitting layers 11.

The organic light-emitting layers 11 emit light due to recombination of carriers (holes and electrons). Each organic light-emitting layer 11 includes an organic material corresponding to one of the colors R, G and B.

An organic layer 16 made of the same material as the organic light-emitting layers 11 is formed in each concavity 8. The organic layers 16 are formed simultaneously with the organic light-emitting layers 11 by applying the ink to both of the openings 17 and the concavities 8 during the application process.

The electron transport layer 12 has a function of transporting the electrons injected by the upper electrode 14 to the organic light-emitting layers 11.

The electron injection layer 13 has a function of facilitating injection of the electrons from by the upper electrode 14 to the organic light-emitting layers 11.

The upper electrode 14 is a cathode. Since the organic EL display panel 100 is of a top-emission type, a material with light transmitting properties is used as the material of the upper electrode 14.

Although not illustrated in FIG. 1, a passivation layer is provided on the upper electrode 14 for the purpose of suppressing the deterioration of the organic light-emitting layers 11 as a result of the organic light-emitting layers 11 coming in contact with moisture, the air, and the like. Since the organic EL display panel 100 is of a top-emission type, a material with light transmitting properties, such as SiN (silicon nitride) and SiON (silicon oxynitride), is used as the material of the passivation layer.

It goes without saying that all of the organic light-emitting layers 11 formed in the respective openings 17 may correspond to the same color. Furthermore, the size of the reduced-width areas 21a may differ for each color. This makes it possible to make the light-emitting properties, which differ for each color, uniform.

<Material of Each Layer>

The following shows examples of the material of each layer described above. It should be naturally appreciated, however, that each layer may be formed from a material other than the ones described below.

Substrate 1: insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

Planarizing film 4: polyimide resin or acrylic resin

Lower electrodes 6: Ag (silver), Al (aluminum), an alloy made from silver, palladium and copper, an alloy made from silver, rubidium and gold, MoCr (an alloy made from molybdenum and chromium), or NiCr (an alloy made from nickel and chromium)

Bank 7: acrylic-based resin, polyimide resin, or novolac-type phenolic resin

Organic light-emitting layers 11: a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, and rare earth metal complex (all of these are described in Japanese Patent Application Publication No. H5-163488)

Hole injection layer 9: a metal oxide such as MoOx (molybdenum oxide), WOx (tungsten oxide), and MoxWyOz (molybdenum-tungsten oxide), a metal nitride, or a metal oxynitride.

Hole transport layers 10: a triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styryl amine compound, butadiene compound, polystyrene derivative, triphenylmethane derivative, and tetraphenylbenzene derivative (all of these are described in JP Patent Application Publication No. H5-163488)

Electron transport layer 12: barium, phthalocyanine, or lithium fluoride

Electron injection layer 13: a nitro-substituted fluorenone derivative, thiopyran dioxide derivative, diphenylquinone derivative, perylene tetracarboxyl derivative, anthraquinodimethane derivative, fluorenylidenemethane derivative, anthrone derivative, oxadiazole derivative, perynone derivative, or derivative of quinoline complexes (all of these are described in JP Patent Application Publication No. 5-163488)

Upper electrode 14: ITO (indium tin oxide), or IZO (indium zinc oxide)

The above has described the structure and the like of the organic EL display panel 100. Proving each opening 17 with the first side 17a including the reduced-width area 21a has the advantageous effect of preventing the clogging of nozzles in an inkjet head used during the manufacturing process. The following section describes examples of a manufacturing method for the organic EL display panel 100, together with the above-described advantageous effect.

<Manufacturing Method>

A description is now given of a method of manufacturing the organic EL display panel 100 as a whole. After that, the application process of the manufacturing method will be discussed in detail.

(Overview)

Figure 3A:
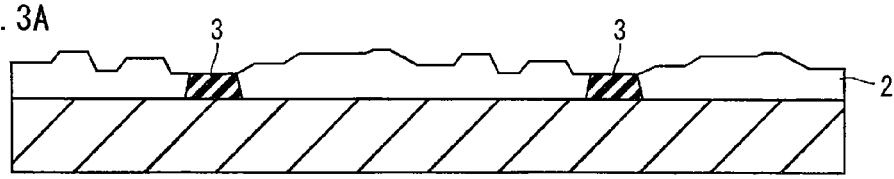
FIGS. 3A to 3E show an example of a manufacturing process for the organic EL display panel pertaining to Embodiment 1.

First, the substrate 1 is prepared on which the TFT layer 2 and the power supply electrodes 3 are formed (FIG. 3A).

Figure 3B:
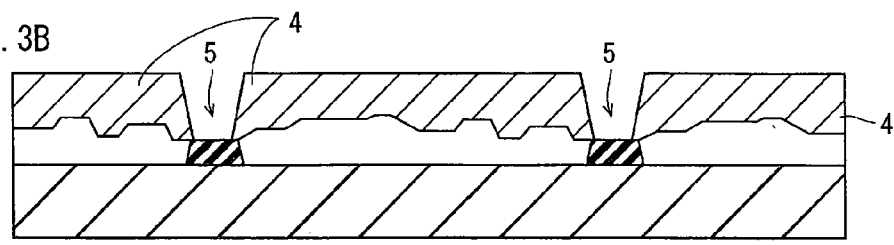

Thereafter, in accordance with a photoresist method, the planarizing film 4 having a thickness of approximately 4 μm is formed on the TFT layer 2 and the power supply electrodes 3. Note, the planarizing film 4 is made of an organic material with excellent insulating properties. Then, the contact holes 5 are provided in positions that are each to be sandwiched between a corresponding pair of openings 17 adjacent in the column direction (FIG. 3B) By using the photoresist method in combination with a desirable pattern mask, the planarizing film 4 and the contact holes 5 can be formed simultaneously. It goes without saying, however, that the contact holes 5 are not limited to being formed in accordance with the above-described method. For example, the contact holes 5 may be formed by, after uniformly forming the planarizing film 4, removing portions of the planarizing film 4 at predetermined positions.

Figure 3C:
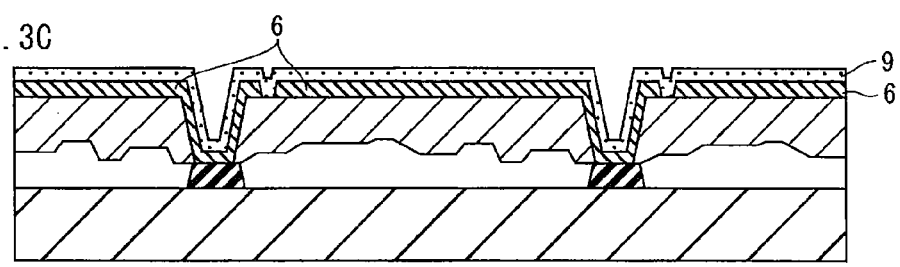

Next, the lower electrodes 6, which are formed from a metal material having a thickness of approximately 150 nm, are formed in one-to-one correspondence with the subpixels in accordance with a vacuum deposition method or a sputtering method, in such a manner that the lower electrodes 6 and the power supply electrodes 3 are brought into conduction. Thereafter, the hole injection layer 9 is formed by reactive sputtering (FIG. 3C).

Figure 3D:
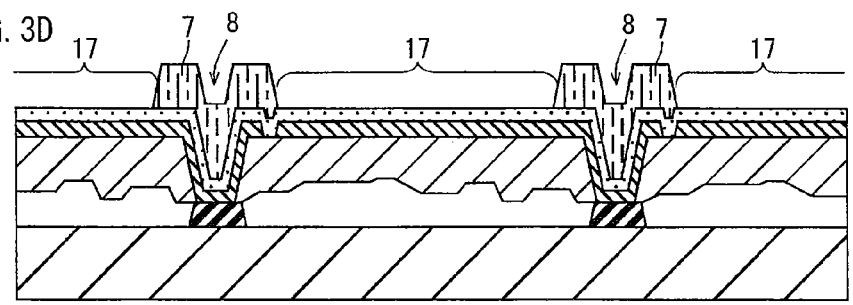

Then, the bank 7 is formed using a photolithography method. First, a paste of bank material containing photosensitive resists is prepared. This bank material is uniformly applied onto the hole injection layer 9. A mask shaped into the pattern of the openings 17, which are illustrated in FIG. 2, is overlaid on the hole injection layer 9. Then, the hole injection layer 9, on which the mask is overlaid, is exposed to light. As a result, a bank pattern is formed. Subsequently, excess bank material is washed off with an aqueous or non-aqueous etchant (developing solution). This concludes the patterning of the bank material. Through the above procedure, formation of the bank 7 is completed with at least repellency provided to the surface thereof. The bank 7 defines the openings 17, in each of which the organic light-emitting layer is to be formed. Also, each concavity 8 is formed on the upper surface of the bank 7 at a position between a corresponding pair of openings 17 adjacent in the column direction (FIG. 3D). In a case where the contact holes 5 are provided as in the present embodiment, the concavities 8 are formed in the course of nature due to the bank material partially sinking into the contact holes 5. It is therefore unnecessary to perform an additional process for separately forming the concavities 8. Hence, the above procedure is advantageous in terms of the production cost and improvement in the manufacturing efficiency.

Note that during the process of forming the bank 7, the surface of the bank 7 may be treated with an alkaline solution, water, or an organic solvent, or may be subjected to plasma treatment, in order to adjust the angle of contact between the bank 7 and the ink to be ejected into the openings 17, or to provide repellency to the surface of the bank 7.

Figure 3E:
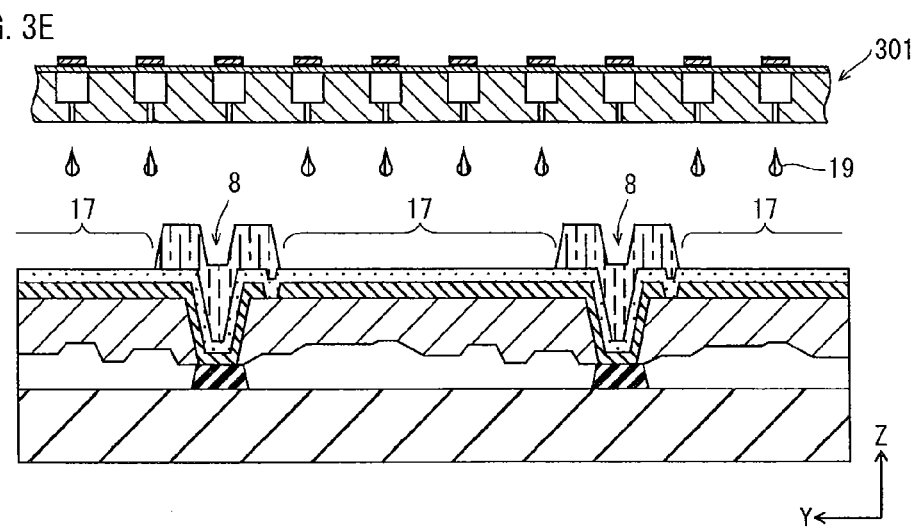
Figure 4A:
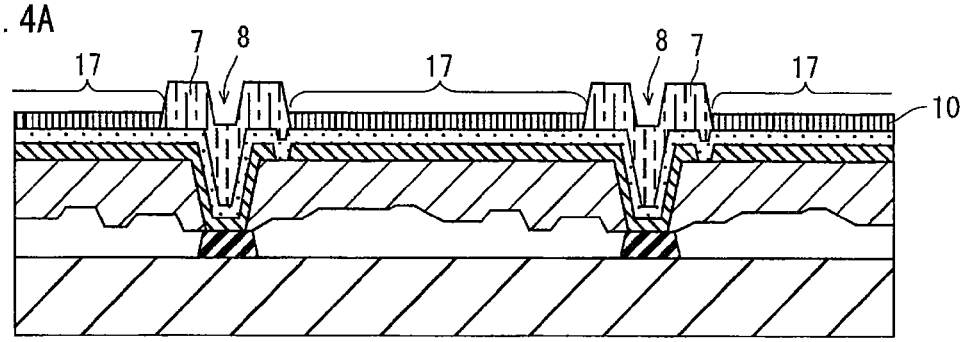
FIGS. 4A to 4D show an example of a manufacturing process for the organic EL display panel pertaining to Embodiment 1.

Next, ink for the hole transport layers 10 is prepared by mixing an organic material to constitute the hole transport layers 10 with a solvent at a predetermined ratio. This ink is supplied to a head unit 301. The head unit 301 ejects drops 19 of the ink for the hole transport layers 10 (hereinafter referred to as "ink drops 19") into each opening 17 in accordance with the application process (FIG. 3E). Thereafter, the solvent contained in the ink for the hole transport layers 10 is dried by evaporation. By performing heating and baking as necessary, the hole transport layers 10 are formed (FIG. 4A).

Figure 4B:
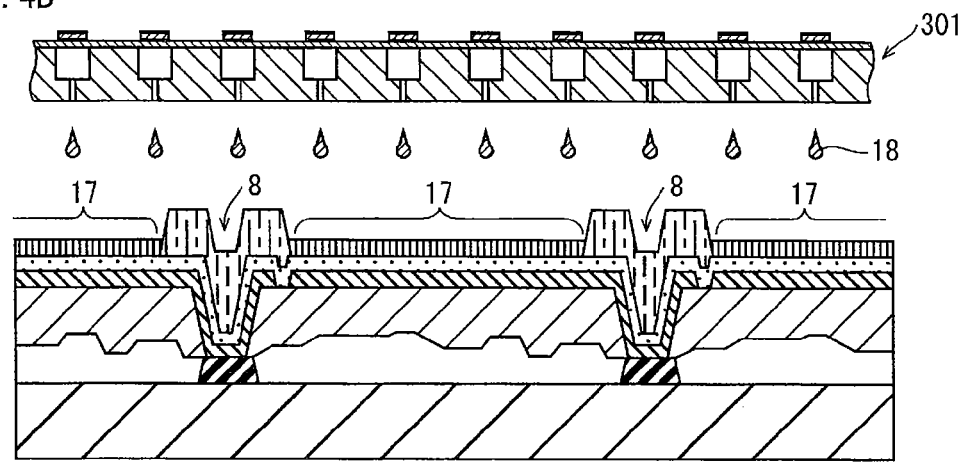
Figure 4C:
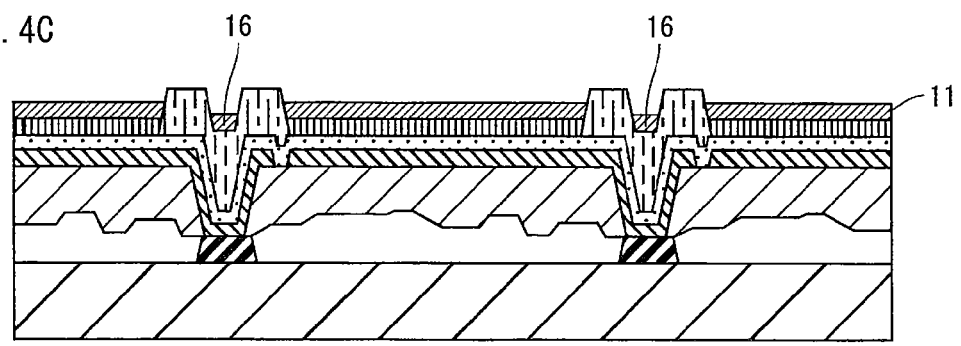

Next, ink for the organic light-emitting layers 11 is prepared by mixing an organic material to constitute the organic light-emitting layers 11 with a solvent at a predetermined ratio. This ink is supplied to the head unit 301. The head unit 301 ejects drops 18 of the ink for the organic light-emitting layers 11 (hereinafter referred to as "ink drops 18") into both of the openings 17 and concavities 8 in accordance with the application process (FIG. 4B). Thereafter, the solvent contained in the ink for the organic light-emitting layers 11 is dried by evaporation. By performing heating and baking as necessary, the organic light-emitting layers 11 and the organic layers 16 made of the same material as the organic light-emitting layers 11 are formed (FIG. 4C). By applying the ink for the organic light-emitting layers 11 into both of the openings 17 and concavities 8 as shown in FIG. 4B, the concentration of the vaporized solvent becomes uniform, and the organic light-emitting layers 11 having a uniform thickness can be formed in all of the openings 17, as will be described in the (Application Process) section below.

Figure 4D:
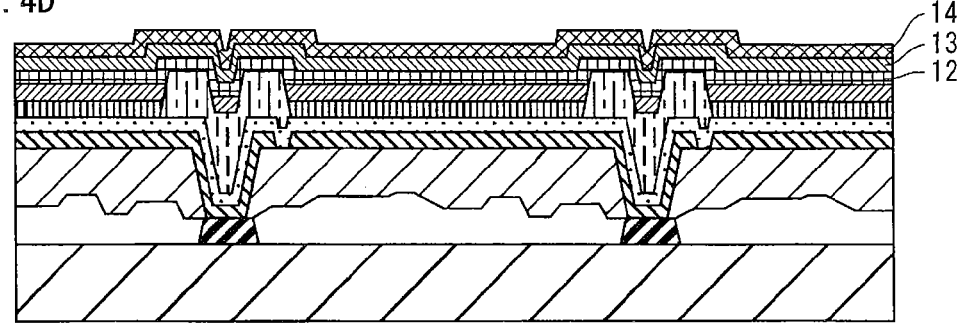

Next, a material for the electron transport layer 12 is formed on the surfaces of the organic light-emitting layers 11 in accordance with a vacuum deposition method. As a result, the electron transport layer 12 is formed. Subsequently, a material for the electron injection layer 13 is formed by deposition, spin coating, casting, or the like. As a result, the electron injection layer 13 is formed. Thereafter, a material such as ITO and IZO is layered by a vacuum deposition method, a sputtering method, or the like. As a result, the upper electrode 14 is formed (FIG. 4D).

Although not illustrated, the passivation layer is formed on the surface of the upper electrode 14 by layering a material with light transmitting properties (e.g., SiN and SiON) by a sputtering method, a CVD method, or the like.

Through the above procedure, manufacturing of the organic EL display panel 100 is completed.

(Application Process)

The following mainly describes the application process conducted to form the hole transport layers 10 and the organic light-emitting layers 11 in detail. First, a description is given of an inkjet device system used in the application process. After that, a description is given of a positional relation between nozzles that eject ink and the substrate onto which the ink is to be applied (hereinafter referred to as "application target substrate").

<<Inkjet Device System 1000>>

FIG. 5 shows a main structure of an inkjet device system 1000 (hereinafter referred to as "system 1000").

As shown in FIG. 5, the system 1000 includes an inkjet table 20, an inkjet head 30, and the like.

The inkjet table 20 is a so-called gantry work table where a gantry unit (movable frame) is disposed so as to move along a pair of guiding shafts above a base table.

A specific structure of the inkjet table 20 is as follows. Columnar stands 201A, 201B, 202A and 202B are mounted on the four corners of an upper surface of a plate-like base 200. A fixed stage ST and an ink pan (dish-like container) IP are disposed in an inner region surrounded by the columnar stands 201A, 201B, 202A and 202B. The application target substrate is placed on the fixed stage ST. Immediately before the ink is applied, the ink is ejected into the ink pan IP to stabilize the ejection properties.

Furthermore, guiding shafts 203A and 203B are supported by the columnar stands 201A, 201B, 202A and 202B so as to extend in parallel to each other along the lengthwise (Y) direction of the base 200. The guiding shafts 203A and 203B are inserted through linear motors 204 and 205, respectively. A gantry unit 210 is mounted on the linear motors 204 and 205 so as to extend in a direction perpendicular to the lengthwise direction of the guiding shafts 203A and 203B. When the above system 1000 is driven, the pair of linear motors 204 and 205 is driven as well, thus enabling the gantry unit 210 to slide back and forth along the lengthwise direction of the guiding shafts 203A and 203B.

A movable member (carriage) 220 composed of an L-shaped mount is disposed on the gantry unit 210. The movable member 220 is provided with a servo motor 221 (dedicated to the movable member 220). Gears (not illustrated) are attached to the tip of the shaft of the servo motor 221. The gears fit into a guiding groove 211 provided in the gantry unit 210. The guiding groove 211 extends in the lengthwise direction of the gantry unit 210 (the X direction). A small rack extending in the lengthwise direction of the gantry unit 210 is disposed inside the guiding groove 211. The gears are engaged with the rack. Accordingly, when the servo motor 221 is driven, the movable member 220 moves back and forth with precision in the X direction due to a rack and pinion mechanism. The inkjet head 30 is attached to the movable member 220.

It should be noted that the linear motors 204 and 205 and the servo motor 221 are merely examples of the means for moving the gantry unit 210 and the movable member 220. Use of the linear motors 204 and 205 and the servo motor 221 is not indispensable. For example, a timing belt mechanism or a ball screw mechanism may be used to move at least one of the gantry unit 210 and the movable member 220.

The inkjet head 30 operates in accordance with a commonly-known piezoelectric method, and is compose of the head unit 301 and a body 302. The head unit 301 is fixed to the movable member 220 via the body 302. A servo motor is built in the body 302. By rotating this servo motor, the angle formed between the lengthwise direction of the head unit 301 and the X axis of the fixed stage ST is adjusted.

A plurality of nozzles are provided on a surface of the head unit 301 facing the fixed stage ST. These nozzles are aligned in a row along the lengthwise direction of the head unit 301. The ink supplied to the head unit 301 is ejected from each nozzle to the application target substrate.

With use of the system 1000 having the above structure, the application process is performed in accordance with an inkjet method. First, an operator selects one of the row direction and the column direction along which the inkjet head 30 should be moved to apply the ink onto the application target substrate. Next, the operator adjusts the angle formed between the lengthwise direction of the head unit 301 and the X axis of the fixed stage ST. This enables the nozzles provided in the head unit 301 to pass over predetermined locations on the application target substrate. This angle adjustment is performed as necessary in accordance with the standard and the size of the substrate, and will be described in detail in the next section.

<<Positional Relation between Head Unit and Application Target Substrate>>

The following describes the case where the ink application is performed by moving the head unit in the row direction (horizontal ink ejection).

Figure 14:
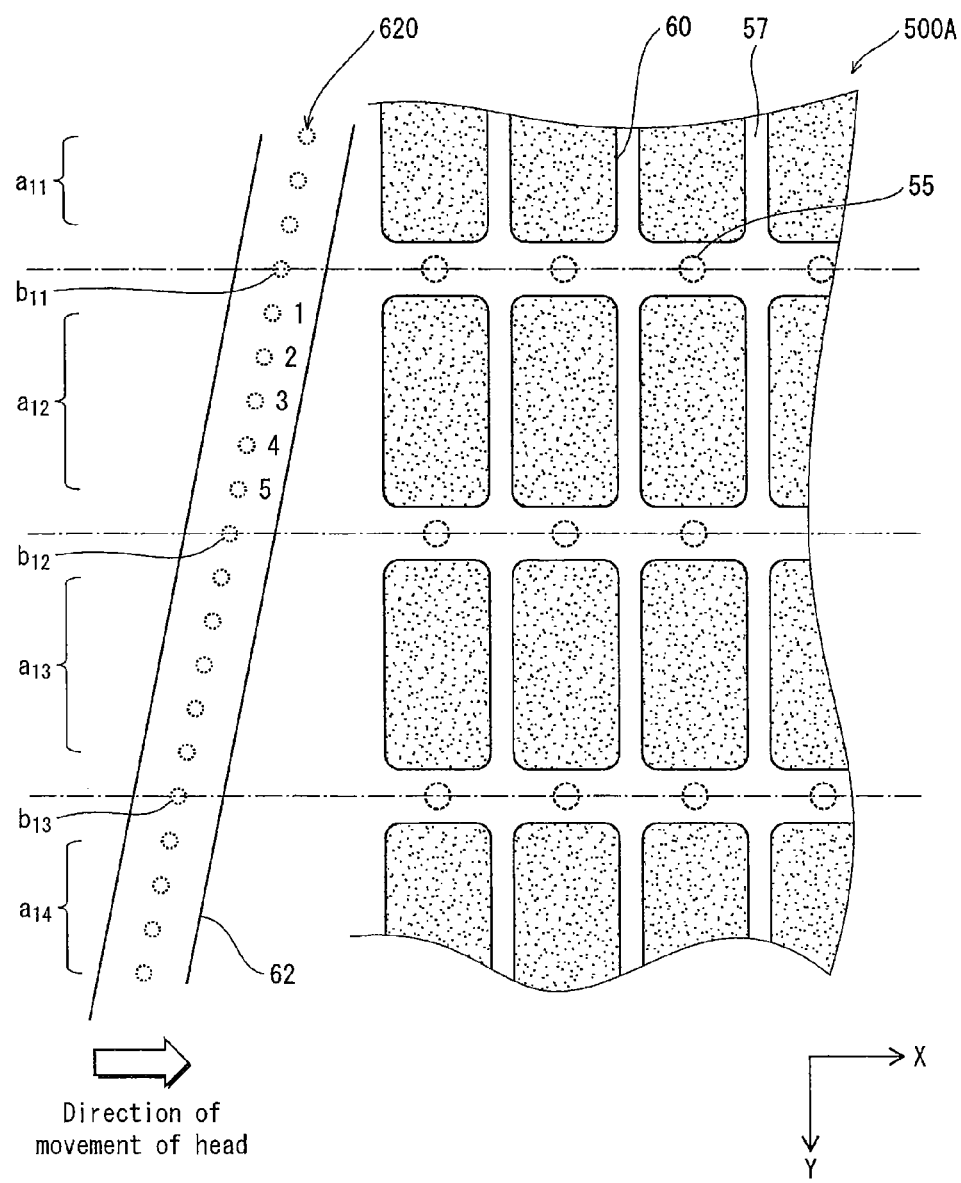
FIG. 14 shows a positional relation between an application target substrate and a head unit during a manufacturing process for a conventional organic EL display panel.

FIG. 14 shows a positional relation between an application target substrate and a head unit 62 (equivalent to the head unit 301 in FIG. 5) during a manufacturing process for a conventional organic EL display panel. In FIG. 14, the reference sign 500A is appended to the application target substrate. FIG. 14 shows the application target substrate 500A before it undergoes the application process. A bank 57 formed on the application target substrate 500A is a grid defining a plurality of openings 60 arranged in a matrix. The head unit 62 is provided with a plurality of nozzles 620 from which the ink is ejected. The nozzles 620 provided in the head unit 62 are aligned in a row. The ink is ejected into the openings 60 while moving the head unit 62 in the row direction. At this time, the ejection pitch of the nozzles 620 is adjusted by slightly inclining the lengthwise direction of the head unit 62 with respect to the column direction. In the example shown in FIG. 14, the ejection pitch of the nozzles 620 is adjusted so that nozzle groups $a_{11}, a_{12}, a_{13}$ and $a_{14}$ correspond to the openings 60, and nozzles $b_{11}$, $b_{12}$ and $b_{13}$ correspond to positions that are each between a pair of openings 60 adjacent in the column direction.

With the above adjustment, during the process for forming the organic light-emitting layers and the hole transport layers, the ink is ejected from the nozzle groups $a_{11}$, $a_{12}$, $a_{13}$ and $a_{14}$, but not from the nozzles $b_{11}$, $b_{12}$ and $b_{13}$. Generally speaking, the ink used to form the organic light-emitting layers and the hole transport layers has higher viscosity than printing ink used in inkjet printers. Thus, there are times when the nozzles $b_{11}$, $b_{12}$ and $b_{13}$, which are set not to eject the ink, are clogged due to solidification of the ink therein. Clogged nozzles cannot eject a preset amount of ink within a preset period of time, and thus may fail to eject the ink into all of the openings 60. This could result in loss of substrates, or require replacement of the head unit 301. In this case, it is necessary to perform extra operations for detaching the head unit 301, cleaning the head unit 301, then reattaching the head unit 301 while maintaining alignment of nozzles in the head unit 301 with high accuracy. This could significantly reduce the production efficiency.

Figure 6:
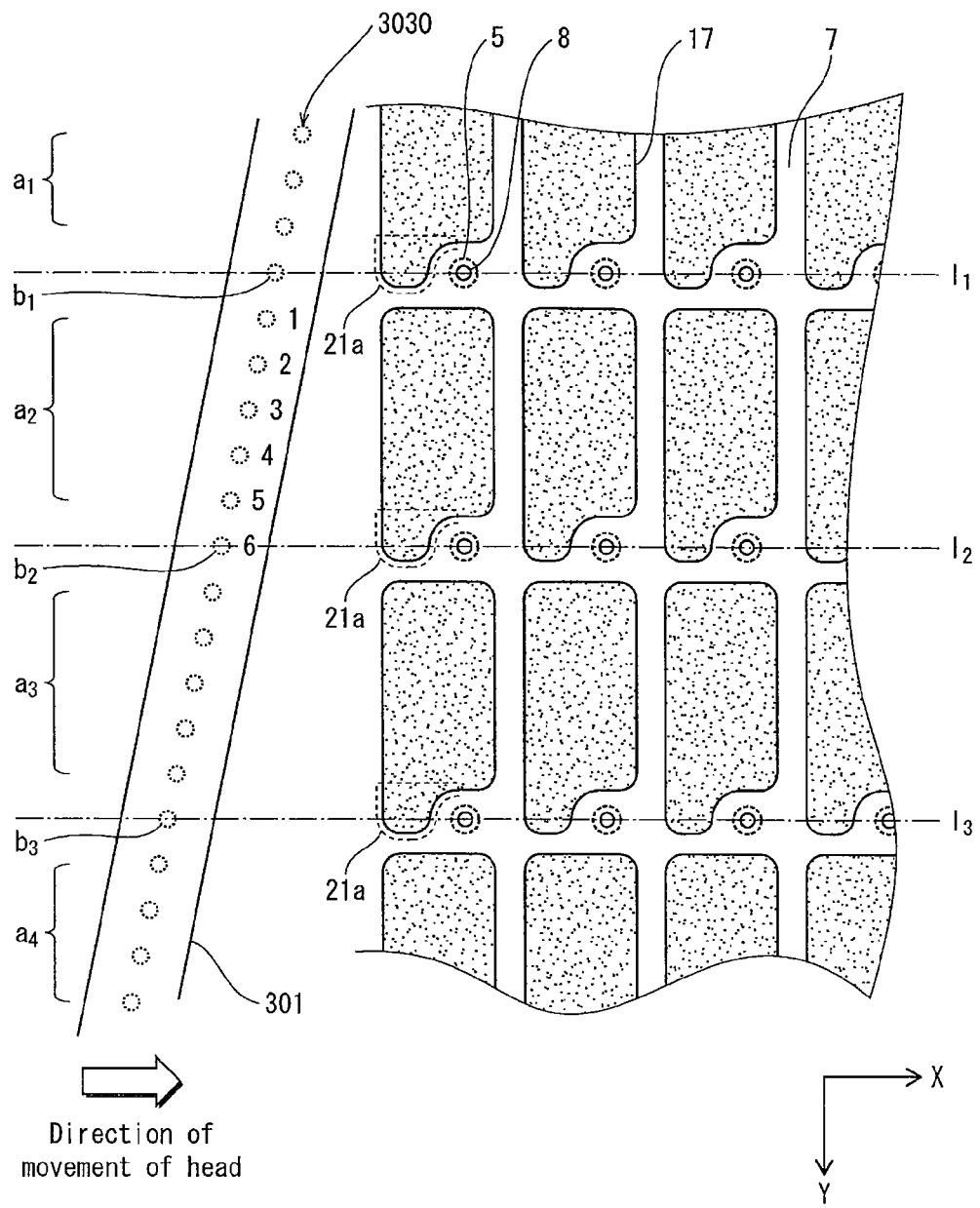
FIG. 6 shows a positional relation between an application target substrate and a head unit pertaining to Embodiment 1 (upon horizontal ink ejection).

On the other hand, FIG. 6 shows a positional relation between the application target substrate and the head unit 301 pertaining to Embodiment 1 (upon horizontal ink ejection). As with the case of FIG. 14, the head unit 301 is provided with a plurality of nozzles 3030 from which the ink is ejected. The nozzles 3030 provided in the head unit 301 are aligned in a row. In FIG. 6, nozzle groups $a_1$, $a_2$, $a_3$ and $a_4$ are arranged to correspond to the openings 17 except for the reduced-width areas 21a, whereas nozzles $b_1$, $b_2$, and $b_3$ are arranged to correspond to lines $I_1$, $I_2$ and $I_3$ passing through the reduced-width areas 21a and the concavities 8 (contact holes 5). Therefore, every nozzle 3030 is adjusted to pass over the openings 17 including the reduced-width areas 21a or over the concavities 8; that is to say, there are no nozzles 3030 that are set not to eject the ink. By thus using every nozzle 3030 in the head unit 301 to apply the ink into the openings 17 having the reduced-width areas 21a and the concavities 8, i.e., by eliminating nozzles 3030 that are set not to eject the ink, clogging of the nozzles 3030 can be effectively prevented.

As shown in FIG. 14, according to the conventional structure, the number of nozzles used to eject the ink into each opening 60 is five. In contrast, according to the structure pertaining to the present embodiment, the number of nozzles used to eject the ink into each opening 17 (including the reduced-width area 21a) is six. Hence, the number of nozzles used to eject the ink into each opening is larger with the structure pertaining to the present embodiment than with the conventional structure. The following describes the advantageous effects derived from this difference between the structure pertaining to the present embodiment and the conventional structure.

During the application process, if one or more nozzles become unusable due to clogging, the total amount of ink drops ejected into each opening 17 is maintained by causing, out of all the nozzles used to eject the ink drops into the openings 17, nozzles other than the unusable nozzles to eject a larger amount of ink drops. By increasing the number of nozzles used to eject the ink drops into each opening 17, it is possible to suppress the increase in the amount of ink drops ejected from each of the nozzles other than the unusable nozzles. In this way, the total amount of ink drops ejected into each opening 17 is easily maintained, and the burden on the nozzles other than the usable nozzles can be alleviated.

The following describes the case where the ink application is performed by moving the head unit 301 in the column direction (vertical ink ejection).

Figure 7:
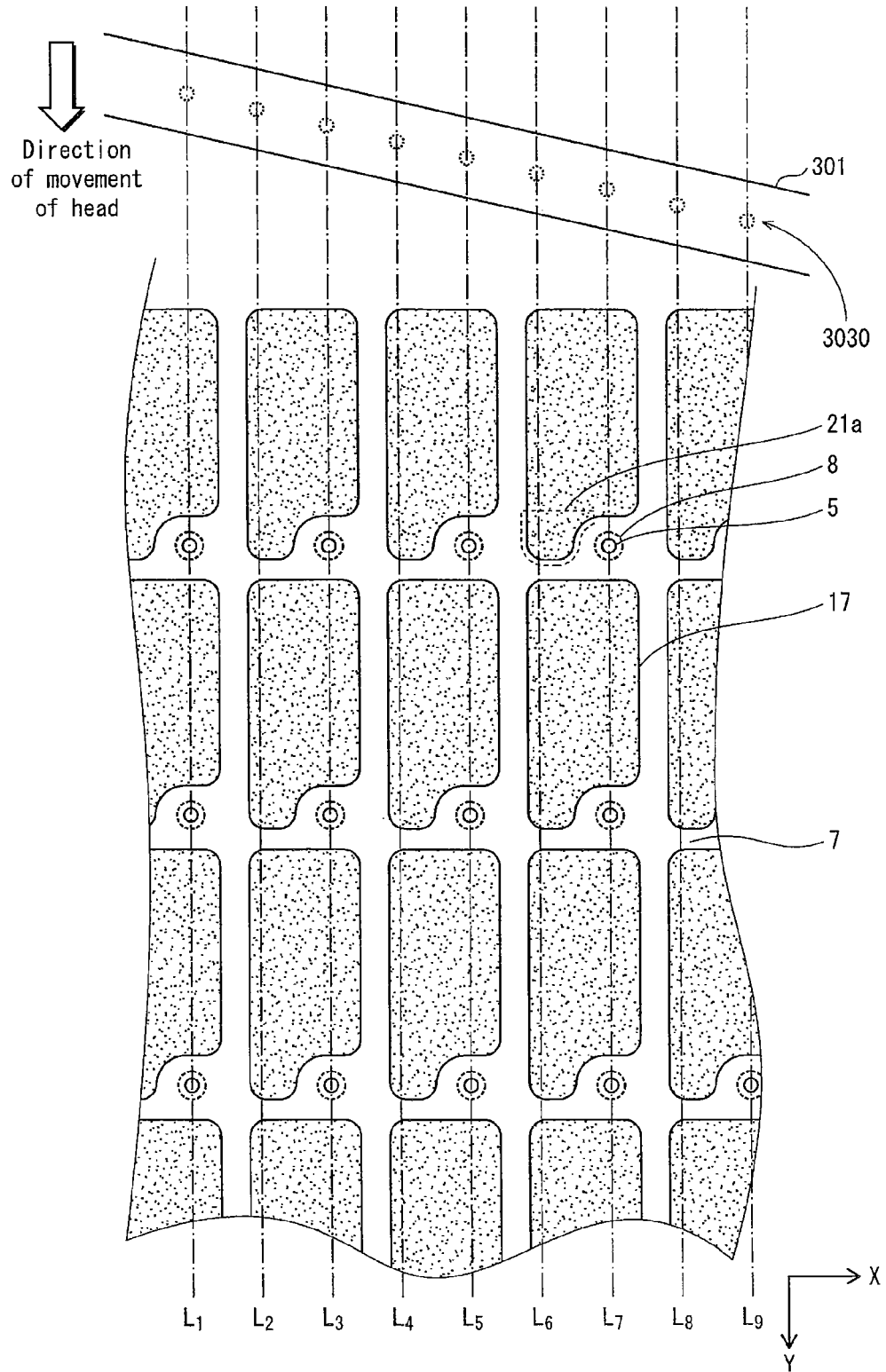
FIG. 7 shows a positional relation between an application target substrate and a head unit pertaining to Embodiment 1 (upon vertical ink ejection).

FIG. 7 shows a positional relation between the application target substrate and the head unit 301 pertaining to Embodiment 1 (upon vertical ink ejection). In the case of vertical ink ejection, the angle formed between the lengthwise direction of the head unit 301 and the row direction is adjusted so that each nozzle 3030 is positioned to pass over either (i) one of the lines $L_1$, $L_3$, $L_5$, $L_7$ and $L_9$, each passing through a corresponding column of openings 17 (excluding the reduced-width areas 21a) and concavities 8 (contact holes 5), or (ii) one of the lines $L_2$, $L_4$, $L_6$ and $L_8$, each passing through the reduced-width areas 21a.

In this case of vertical ink ejection, although each nozzle 3030 ejects the ink intermittently, a time period for which each nozzle 3030 halts the ink ejection is short as compared to the conventional case. Accordingly, the present embodiment offers an advantageous effect that clogging of the ink in the nozzles is prevented also in the case of vertical ink ejection.

According to the present embodiment, in either case of horizontal ink ejection or vertical ink ejection, the ink for the organic light-emitting layers 11 is ejected into both of the reduced-width areas 21a and the concavities 8; however, it is also possible to configure the nozzles 3030 so as not to eject the ink for the organic light-emitting layers 11 into the concavities 8. However, in this case, the solvent does not evaporate from the concavities 8. Since the concentration of the vaporized solvent is low around a certain region of each reduced-width area 21a that is adjacent in the row direction to the corresponding concavity 8, evaporation of the solvent is facilitated more in such a region than in the other region of each reduced-width area 21. When drying of the solvent progresses in the atmosphere with the uneven concentration of vaporized solvent, the film thickness of the organic light-emitting layer 11 becomes large in the certain region of each reduced-width area 21a that is adjacent in the row direction to the corresponding concavity 8. This could result in failure to form the organic light-emitting layers 11 having a uniform film thickness.

On the other hand, when the ink is ejected into both of the reduced-width areas 21a and the concavities 8 as in the present embodiment, the concentration of solvent vaporized from the ink becomes uniform. This makes it possible to form the organic light-emitting layers 11 having a uniform thickness in the openings 17 including the reduced-width areas 21a. Accordingly, the present embodiment can suppress various types of unevenness in light emission (e.g., unevenness in light emission in the row and column directions, and unevenness in light emission across the surface), and offers excellent image display performance as compared to conventional techniques.

Embodiment 2

Embodiment 1 has described the structure in which, as to any pair of openings 17 adjacent in the column direction, only one of opposing sides of the pair of openings 17 includes the reduced-width area 21a that is reduced in width in the row direction. On the other hand, Embodiment 2 describes the structure in which, as to any pair of openings 17 adjacent in the column direction, both of opposing sides of the pair of openings 17 include the reduced-width area that is reduced in width in the row direction. The following describes Embodiment 2 with a focus on the differences between Embodiments 1 and 2.

<Structure>

Figure 8:
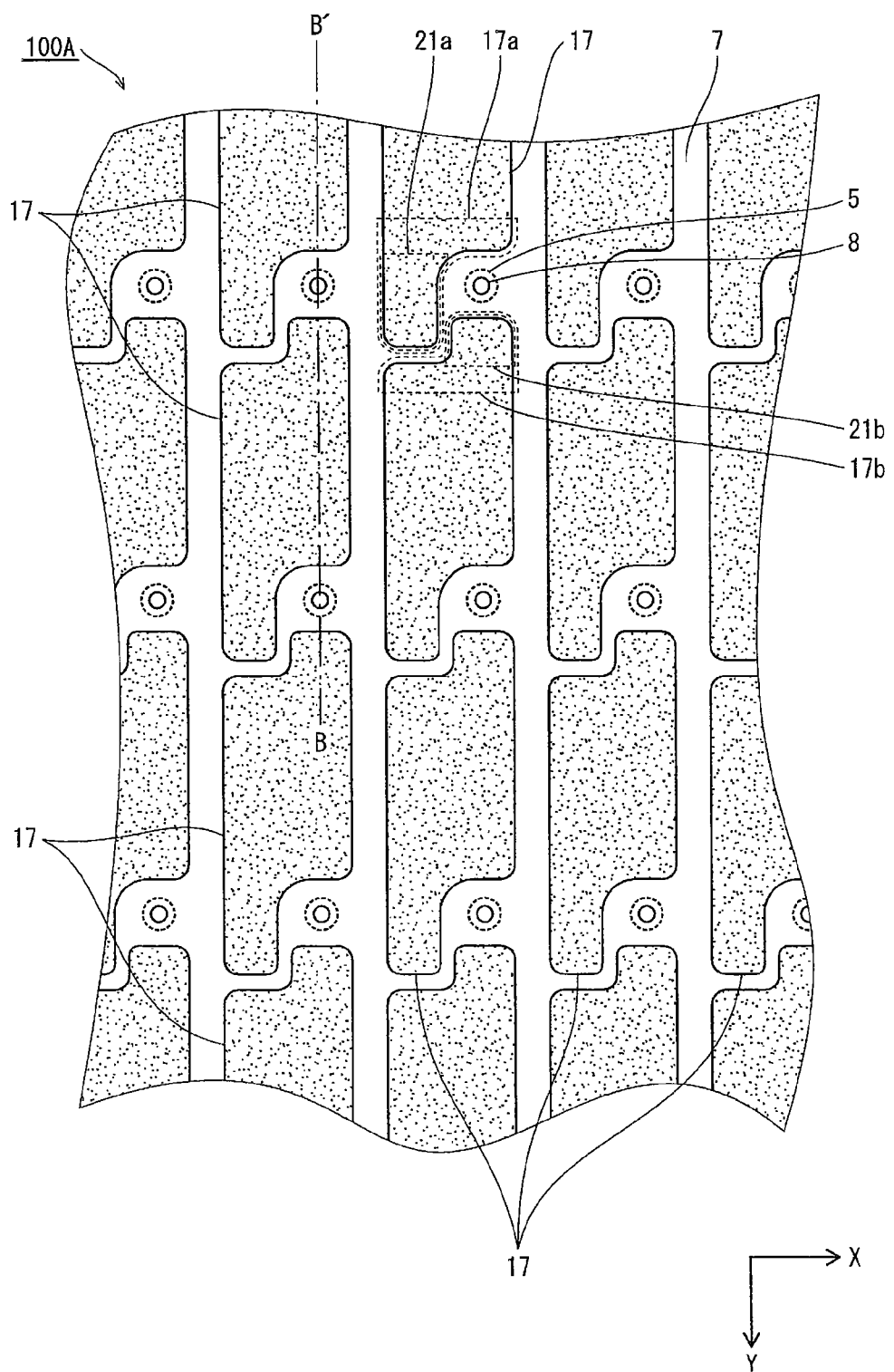
FIG. 8 is a schematic diagram showing the shape of a bank of an organic EL display panel pertaining to Embodiment 2.

FIG. 8 is a schematic diagram showing the shape of a bank of an organic EL display panel 100A pertaining to the present embodiment. A partial cross-sectional view of the organic EL display panel 100A taken along B-B' in FIG. 8 is similar to that shown in FIG. 1.

As with FIG. 1, a first side 17a of each opening 17 includes a reduced-width area 21a that (i) is reduced in width in the row direction and (ii) extends in the column direction toward an area that is adjacent in the row direction to the corresponding contact hole 5. In fact, in the present embodiment, each reduced-width area 21a extends in the column direction past the area that is adjacent in the row direction to the corresponding contact hole 5. As a result of each reduced-width area 21a extending in the above manner, a part of a second side 17b of the opening 17 that is adjacent in the column direction to the reduced-width area 21a has been removed. Therefore, the second side 17b of each opening 17 includes a reduced-width area 21b. As such, the reduced-width areas 21a and 21b alternate along the column direction. Moreover, each reduced-width area 21a extends toward the removed part of the corresponding second side 17b. That is to say, each reduced-width area 21a and the corresponding second reduced-width area 21b are partially adjacent in the row direction to each other. Therefore, in the present embodiment, as with the first sides 17a, the second sides 17b each include a part having the original width of the opening 17 and a part having a width smaller than the original width of the opening 17, i.e., the reduced-width area 21b. Although not particularly illustrated in the drawings, the lower electrodes pertaining to the present embodiment are formed in one-to-one correspondence with subpixels to match the shape of each opening 17 including the reduced-width areas 21a and 21b.

In the present embodiment, the area of the opening of each second side 17b is reduced, but in accordance with such reduction, the area of the opening of each first side 17a is enlarged. Therefore, the overall area of each opening 17 pertaining to Embodiment 2 is similar to the area of each opening 17 pertaining to Embodiment 1. Accordingly, the above structure makes it possible to increase the area of light emission. As a result, the luminance of emitted light can be improved without increasing the current density of current flowing through the organic light-emitting layers.

The above has described the structure of the organic EL display panel 100A. As each reduced-width area 21a and the corresponding reduced-width area 21b are partially adjacent in the row direction to each other, when one or more of the nozzles become unusable during the application process, the present embodiment offers the advantageous effect of further alleviating the burden on the nozzles other than the unusable nozzles. The following section describes examples of a manufacturing method for the organic EL display panel pertaining to the present invention, together with the above-described advantageous effect.

<Manufacturing Method>

The overall manufacturing method is the same as the one shown in FIGS. 3A to 4D, and is therefore omitted from the following description. However, the mask pattern layered on the resists during the process shown in FIG. 3D is different between the present Embodiment 2 and the above Embodiment 1.

Figure 9:
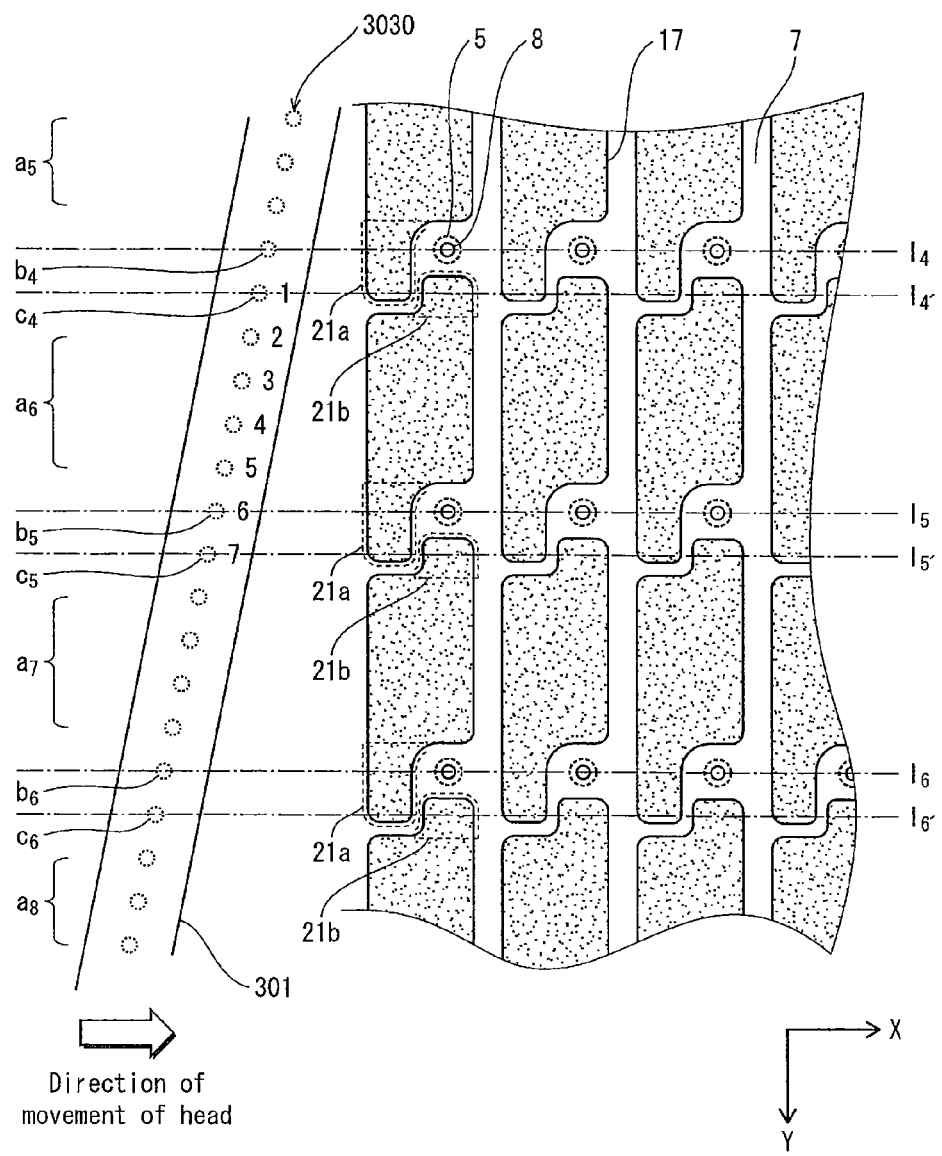
FIG. 9 shows a positional relation between an application target substrate and a head unit pertaining to Embodiment 2 (upon horizontal ink ejection).

FIG. 9 shows a positional relation between the application target substrate and the head unit 301 pertaining to Embodiment 2 (upon horizontal ink ejection). As with FIG. 6, the head unit 301 is provided with a plurality of nozzles 3030 that eject ink. The nozzles 3030 provided in the head unit 301 are aligned in a row. Referring to FIG. 9, nozzle groups $a_5$, $a_6$, $a_7$ and $a_8$ are arranged to correspond to areas of the openings 17 other than the reduced-width areas 21a. Nozzles $b_4$, $b_5$ and $b_6$ are arranged respectively to correspond to the lines $I_4$, $I_5$ and $I_6$ passing through the reduced-width areas 21a and the concavities 8. Nozzles $c_4$, $c_5$ and $c_6$ are arranged respectively to correspond to the lines $L_4'$, $I_5'$ and $I_6'$ passing through both of the reduced-width areas 21a and 21b. Therefore, every nozzle 3030 is adjusted to pass over the openings 17 including the reduced-width areas 21a and 21b, or over the concavities 8. That is to say, there are no nozzles 3030 that are set not to eject the ink. Consequently, clogging of the nozzles can be effectively prevented as in Embodiment 1.

With the structure pertaining to Embodiment 1, the number of nozzles used to eject the ink into each opening 17 (including the reduced-width area 21a) is six, as shown in FIG. 6. In contrast, with the structure pertaining to the present embodiment, the number of nozzles used to eject the ink into each opening 17 (including the reduced-width areas 21a and 21b) is seven, as shown in FIG. 9. Hence, the present embodiment further increases the number of nozzles used to eject the ink into each opening 17. By increasing the number of nozzles used to eject the ink drops into each opening 17, it is possible to suppress the increase in the amount of ink drops ejected from each of the nozzles other than the unusable nozzles. In this way, the total amount of ink drops ejected into each opening 17 is easily maintained, and the burden on the nozzles other than the usable nozzles can be further alleviated.

Although not particularly illustrated in the drawings, as with Embodiment 1, the present embodiment also offers the advantageous effect of preventing clogging of the nozzles in the case of vertical ink ejection by adjusting the angle formed between the lengthwise direction of the head unit 301 and the row direction.

Furthermore, in the present embodiment, in either case of horizontal ink ejection or vertical ink ejection, the concentration of solvent vaporized from the entire panel is uniform. Accordingly, the present embodiment can suppress unevenness in light emission in the row and column directions, unevenness in light emission across the surface, etc., and offers excellent image display performance as compared to conventional techniques.

Figure 10A:
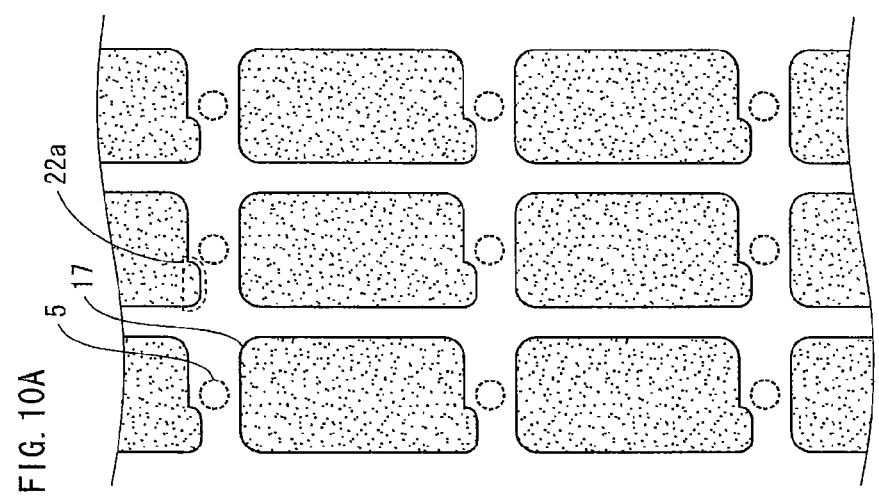
FIGS. 10A to 10C are schematic diagrams showing the shapes of banks of organic EL display panels pertaining to modification examples.
Figure 10B:
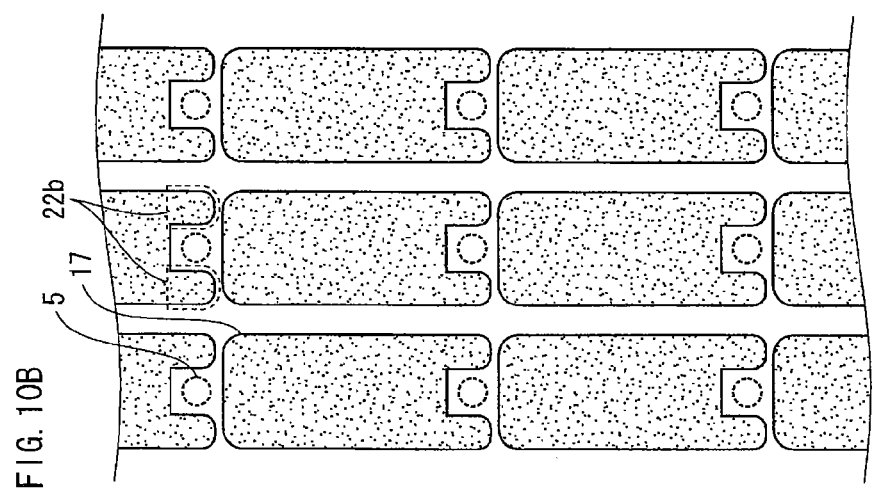
Figure 10C:
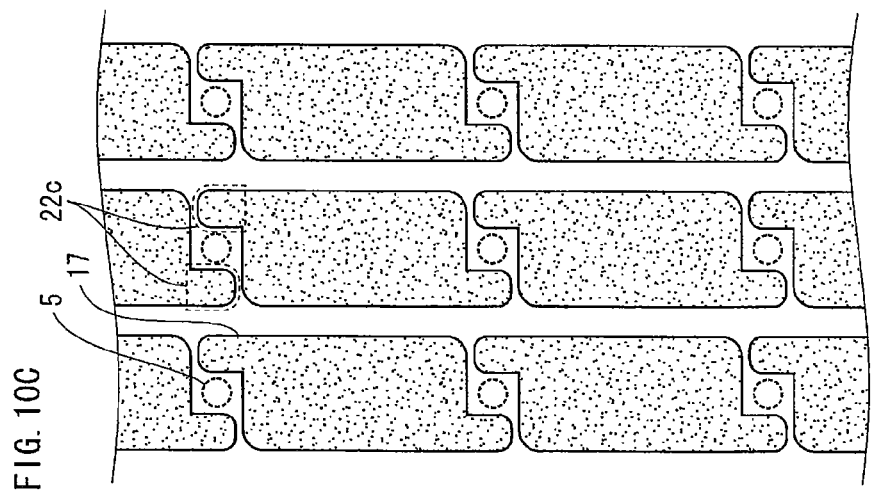

MODIFICATION EXAMPLES (1) In the above embodiments, each contact hole is distanced in the row direction from a virtual line passing through the centers of the corresponding column of openings, and each reduced-width area is formed to extend toward an area opposite to the corresponding contact hole with respect to such a virtual line. However, the present invention is not limited in this way. For example, as shown in FIGS. 10A, 10B and 10C, each contact hole 5 may be positioned on a virtual line passing through the centers of the corresponding column of openings 17, and each of the reduced-width areas 22a, 22b, and 22c may be arranged on an area that is adjacent in the row direction to the corresponding contact hole 5.

(2) In the above embodiments, each reduced-width area 21a extends in the column direction so as to be adjacent in the row direction to the corresponding contact hole. However, in the present invention, the area of light emission can be enlarged as long as each reduced-width area 22a extends, even if only slightly, towards an area that is adjacent in the row direction to the corresponding contact area, as shown in the example of FIG. 10A.

(3) Embodiment 2 has introduced the structure in which each opening includes two reduced-width areas that respectively extend in two different directions toward two adjacent openings. Alternatively, as shown in FIG. 10B, each opening may include two reduced-width areas that both extend in the same direction toward one adjacent opening so as to avoid the corresponding contact hole. Alternatively, as shown in FIG. 10C, each opening may include two reduced-width areas that respectively extend in two different directions toward two adjacent openings so as to avoid the corresponding contact hole. Either of the configurations shown in FIGS. 10B and 10C can enlarge the area of light emission as compared to conventional configurations.

(4) The shape of the openings may be selected from various types of shapes. The shapes of the openings illustrated in FIGS. 10A to 10C are merely examples. It should be naturally appreciated that the openings may have a shape other than the shapes illustrated in FIGS. 10A to 10C.

(5) FIG. 1 shows the structure in which the layers ranging from the TFT layer 2 to the upper electrode 14 are layered on the substrate 1. However, in the present invention, one or more of these layers may not be provided, or other layers (e.g., a transparent conductive layer) may be additionally provided.

(6) In the process of FIG. 3E, ink drops 19 for the hole transport layers are not ejected into the concavities 8. Alternatively, in the present invention, the ink drops 19 for the hole transport layers may be ejected into the concavities 8 as well, so as to form organic layers made of the same material as the hole transport layers in the concavities 8. This makes the concentration of solvent vaporized from the ink for the hole transport layers uniform, thus forming the hole transport layers 10 having a uniform thickness. Furthermore, ink drops 18 for the organic light-emitting layers may not be ejected into the concavities 8 in the process of FIG. 4B.

(7) The concavities, which are formed as a result of portions of the bank sinking into the contact holes, are not essential constituent elements in the present invention. For example, enlargement of the area of each opening is not influenced by a configuration in which such portions of the bank corresponding to the concavities are filled with the material of the bank.

[Display Device]

Figure 11:
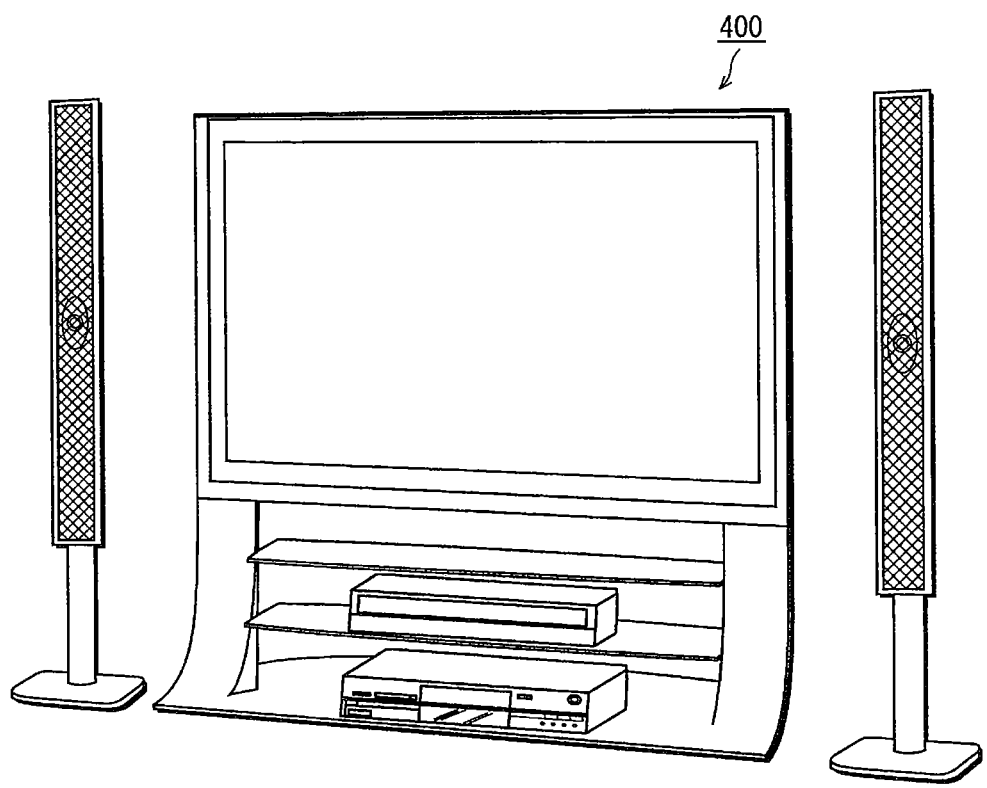
FIG. 11 is an external perspective view of a display device.
Figure 12:
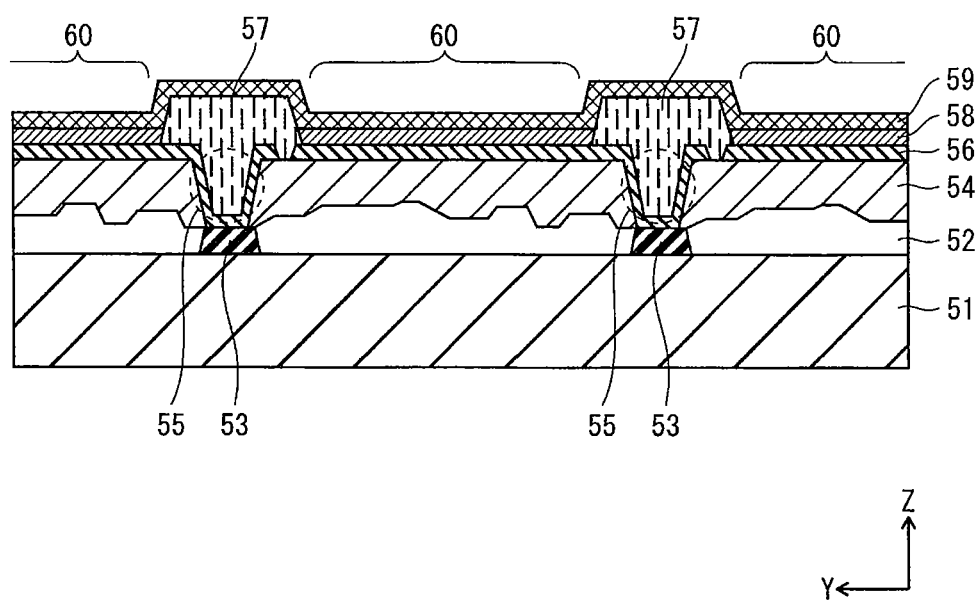
FIG. 12 is a partial cross-sectional view showing the structure of a conventional organic EL display panel.

FIG. 11 is an external perspective view of a display device 400. The display device 400 comprises one of (i) an organic EL display panel 100 pertaining to one embodiment of the present invention, (ii) an organic EL display panel 100A pertaining to another embodiment of the present invention, and (iii) an organic EL display panel pertaining to any of the modification examples. With the above structure, the display device 400 serves as an organic EL display device that can achieve the above-described advantageous effects.

INDUSTRIAL APPLICABILITY

The organic EL display panel of the present invention is suitable as a display equipped in various types of display devices, television devices, mobile electronic devices, etc. for home use, public use, or business use.

REFERENCE SIGNS LIST 1 substrate
2 TFT layer
3 power supply electrode
4 planarizing film
5 contact hole
6 lower electrode
7 bank
8 concavity
9 hole injection layer
10 hole transport layer
11 organic light-emitting layer
12 electron transport layer
13 electron injection layer
14 upper electrode
16 organic layer made of material of light-emitting layer
17 opening
17a first side
17b second side
18 drops of ink for organic light-emitting layer
19 drops of ink for hole transport layer
20 inkjet table
21a reduced-width area
21b reduced-width area
22a reduced-width area
22b reduced-width area
22c reduced-width area
30 inkjet head
100, 100A organic EL display panel
200 base
210 gantry unit
220 movable member
301 head unit
302 body
400 display device
500 organic EL display panel
500A application target substrate
1000 inkjet device system
51 substrate
52 TFT layer
53 power supply electrode
54 planarizing film
55 contact hole
56 lower electrode
57 bank
58 organic light-emitting layer
59 upper electrode
60 opening
62 head unit
620 nozzle

The invention claimed is:
1. A method of manufacturing an organic EL display panel, comprising the steps of:
preparing a substrate;
forming a TFT layer on the substrate;
forming a planarizing film above the TFT layer;
providing a plurality of contact holes in the planarizing film such that the contact holes penetrate the planarizing film;
arranging a plurality of lower electrodes in a matrix above the planarizing film in such a manner that the TFT layer and the lower electrodes are brought into conduction via the contact holes, the lower electrodes corresponding one-to-one to pixel units;
forming, above the planarizing film, a bank defining a plurality of openings corresponding one-to-one to the lower electrodes;
forming organic light-emitting layers in the openings in one-to-one correspondence; and
forming an upper electrode above the organic light-emitting layers, wherein the bank is formed such that
each contact hole is positioned between a corresponding pair of the openings adjacent in a column direction, and
at least one of opposing sides of any pair of the openings adjacent in the column direction includes a reduced-width area that (i) is reduced in width in a row direc- tion and (ii) extends in the column direction so as to be adjacent in the row direction to a corresponding one of the contact holes, the organic light-emitting layers are formed by (i) causing a plurality of nozzles provided in an inkjet head to eject drops of ink into each opening, the ink containing one or more solvents and one or more organic materials to constitute the organic light-emitting layers, and (ii) drying the one or more solvents by evaporation, and in the step of forming the organic light-emitting layers, the inkjet head is positioned so that the nozzles are aligned in the column direction, while the inkjet head is being moved in the row direction, every one of the nozzles is set to eject the drops of ink by (i) causing predetermined nozzles that pass over the contact holes to eject the drops of ink into the reduced-width area of each opening, the predetermined nozzles being included among the nozzles, and (ii) causing the rest of the nozzles other than the predetermined nozzles to eject the drops of ink into an area of each opening excluding the reduced-width area thereof, and as to any pair of the openings adjacent in the column direction, a column-direction gap between opposing edges of the reduced-width area of one opening and the other opening is smaller than a column-direction gap between any pair of the nozzles adjacent in the column direction.

2. The method according to claim 1, wherein the bank is formed such that said opposing side of the other opening includes a reduced-width area that is reduced in width in the row direction, as to any pair of the openings adjacent in the column direction, the reduced-width area of one opening extends in the column direction past the corresponding contact hole so as to be partially adjacent in the row direction to the reduced-width area of the other opening, and the direction in which each reduced-width area extends alternates in the column direction.

3. The method according to claim 1, wherein in the step of forming the bank, a plurality of concavities are formed in portions of the bank as a result of the portions sinking into the contact holes, and in the step of forming the organic light-emitting layers, the predetermined nozzles that pass over the contact holes are caused to further eject the drops of ink into each concavity.

4. The method according to claim 1 further comprising the step of forming charge transport layers in the openings in one-to-one correspondence, wherein the step of forming the charge transport layers is performed between the step of forming the bank and the step of forming the organic light-emitting layers, and the charge transport layers are formed by (i) causing the nozzles provided in the inkjet head to eject drops of another ink into each opening, said another ink containing one or more solvents and one or more organic materials to constitute the charge transport layers, and (ii) drying the one or more solvents by evaporation.

5. The method according to claim 4, wherein in the step of forming the charge transport layers, the inkjet head is positioned so that the nozzles are aligned in the column direction, and while the inkjet head is being moved in the row direction, every one of the nozzles is set to eject the drops of said another ink by (i) causing the predetermined nozzles that pass over the contact holes to eject the drops of said another ink into the reduced-width area of each opening, and (ii) causing the rest of the nozzles to eject the drops of said another ink into the area of each opening excluding the reduced-width area thereof.

6. The method according to claim 5, wherein in the step of forming the bank, a plurality of concavities are formed in portions of the bank as a result of the portions sinking into the contact holes, and in the step of forming the charge transport layers, the predetermined nozzles that pass over the contact holes are caused to further eject the drops of said another ink into each concavity.

* * * * *